United States Patent [19]

Ikeda et al.

[11] Patent Number: 5,376,782
[45] Date of Patent: Dec. 27, 1994

[54] IMAGE PICKUP DEVICE PROVIDING DECREASED IMAGE LAG

[75] Inventors: Chikaho Ikeda; Hiroshi Fujimagari; Junji Okada, all of Kanagawa, Japan

[73] Assignee: Fuji Xerox Co., Ltd., Tokyo, Japan

[21] Appl. No.: 25,792

[22] Filed: Mar. 3, 1993

[30] Foreign Application Priority Data

Mar. 4, 1992 [JP] Japan .................................. 4-081484
Mar. 27, 1992 [JP] Japan .................................. 4-100181
Sep. 18, 1992 [JP] Japan .................................. 4-273466

[51] Int. Cl.$^5$ ...................... H04N 1/028; H01L 27/14
[52] U.S. Cl. .................................... 250/208.1; 348/310
[58] Field of Search ............... 250/208.1, 208.2, 208.3, 250/214 R; 348/309, 310

[56] References Cited

U.S. PATENT DOCUMENTS 4,728,802  3/1988  Baron ........................ 358/213.11
4,945,419  7/1990  Arques ........................... 348/310
5,160,836 11/1992  Miyake ........................... 250/208.1

Primary Examiner—David C. Nelms
Assistant Examiner—John R. Lee
Attorney, Agent, or Firm—Finnegan, Henderson, Farabow, Garrett & Dunner

[57] ABSTRACT

When a forward or reverse voltage is applied to two diodes 1 and 2 connected in series in the same direction, the junction CP of the two diodes is switched for a comparatively low-impedance state to a high-impedance state or vice versa, so that a photoelectric transducer 3 connected to the junction CP is brought to either a reset or storage state. With an improved image pickup device having this construction, the impedance at the junction CP can definitely be held at low level in all instances without being influenced by the amount of illumination on the photoelectric transducer 3, whereby it can be saturated within a predetermined reset time so as to prevent the generation of residual charges.

26 Claims, 19 Drawing Sheets

IMAGE PICKUP DEVICE PROVIDING DECREASED IMAGE LAG

BACKGROUND OF THE INVENTION

1. Field of the Invention

This invention relates to an image pickup device or an array of image pickup devices in an image sensor that is used for reading image with facsimile or image scanner equipment. In particular, this invention relates to an image pickup device of the type that picks up signals after photoelectric conversion in a plurality of diodes formed of an amorphous or polycrystalline semiconductor.

2. Description of Related Art

Conventional image sensors that are used in reading image with facsimile and image scanner equipment are typically designed in such a way that using a line of image pickup devices of substantially the same length as the document width, image signal is read from one line on the document surface by electrical scanning in the line direction while, at the same time, the document is moved by means of a document feed mechanism (in the slow scan direction) as it is scanned electrically to read information from the entire surface of the document. A typical example of image sensor of this type that has so far been proposed is shown in FIG. 1; a photodiode PD and a blocking diode BD are connected in series, with the polarity of PD being opposite to that of BD, so as to form an image pickup device 100, and a plurality of such image pickup devices are arranged in line one-dimensionally. Such array of image pickup devices are typically formed by the thin-film process using the layer of either amorphous semiconductor (a-Si) or polycrystalline semiconductor.

The process of reading image signal with a single unit of image pickup device 100 in the image sensor shown in FIG. 1 is described below with reference to the timing chart FIG. 2. Suppose first that the photodiode PD is already charged at point b. The photodiode is then illuminated with light reflected from the document surface (not shown), whereupon a photocurrent proportional to the amount of light illumination will flow to the anode of the photodiode PD, causing the potential Vcp at the midpoint between the photodiode PD and the blocking diode BD to be discharged toward the ground so as to store electric charges at the node CP (period b–c, or storage time).

Subsequently, voltage Vh is applied to the anode of the blocking diode BD by application of drive pulses (Vpulse), whereupon the blocking diode BD turns on, causing the junction potential Vcp at the midpoint between the two diodes to become substantially equal to Vh; at the same time, the photodiode PD is charged and reset at the voltage Vh (signal reading and reset time).

When the voltage of drive pulses (Vpulse) drops to Vlow, both the photodiode PD and the blocking diode BD are turned off; if the photodiode PD is illuminated with light while it is in the off-state, the storage time just described above is repeated.

As one can see from the above description, the electric charges stored at the node CP during the storage time are released in the subsequent signal reading time to flow out to an external circuit. In other words, charges of the same amount as the positive charges that flowed out of the cathode of the photodiode PD as photocurrent during storage time will be supplied from an external circuit by the signal reading operation, thereby causing a charging current Iout to flow. An image signal output can be produced by detecting the additionally supplied charges as voltage across a resistor R.

The procedure just described above is repeated for all of the image pickup devices arranged in line, whereby image signal can be produced for one line across the document surface over time.

A problem with the process of reading image signal with image pickup devices of the composition described above is that an image lag develops in the document's image in the direction of paper feed, thereby reducing the resolution that can be attained. This phenomenon is described below in greater detail.

Suppose first that the photodiode using an amorphous silicon semiconductor layer is illuminated with light of high intensity during the storage time. If a large charging current flows during the signal reading time, the differential resistance of photodiode PD ($\Delta V/\Delta I$ representing the gradient at point A of the curve shown in FIG. 3) is small and, hence, the time constant expressed by the resistance and the capacity Cp of the photodiode is satisfactorily small.

However, if the illuminating light is of low intensity, only small charges will be stored at the node CP, causing a small charging current to flow during the signal reading time (at reset time); hence, the differential resistance of photodiode PD ($\Delta V/\Delta I$ representing the gradient at point B of the curve shown in FIG. 3) increases. As a result, the time constant defined above also increases, prolonging the time required for the junction potential Vcp to saturate. This may occasionally cause the photodiode to be reset only insufficiently within a preset signal reading time. In other words, the time constant of the photodiode PD is variable with the amount of incident light and, hence, if it is illuminated with low-intensity light, residual charges will develop and when the next line on the document is read, an afterimage may occur to lower the resolution.

SUMMARY OF THE INVENTION

The present invention has been accomplished under these circumstances and has as an object providing an image pickup device that picks up signal after photoelectric conversion using a plurality of diodes formed of an amorphous or polycrystalline semiconductor and which can be reset causing reduced generation of residual charges.

This object can be attained by a system in which two diodes are connected in series in the same direction and in which when either a forward or reverse voltage is to be applied to those diodes, the junction of the two diodes is switched from a comparatively low-impedance state to a high-impedance state or vice versa, so that the photoelectric transducer connected to that junction is brought to either a reset or storage state.

According to a first aspect of the present invention, there is provided an image pickup device comprising: a rectifier group having two diodes connected in series in the same direction; a photoelectric transducer connected to the junction of said two diodes; and a power supply means for applying either a forward or reverse voltage to said rectifier group so that said junction is switched from a comparatively low-impedance state to a high-impedance state or vice versa.

According to a second aspect of the present invention, there is provided an image pickup device comprising: a rectifier group in which a photodiode and a diode each made of an amorphous or polycrystalline semiconductor are connected in series in the same direction; a capacitor connected at one end to the junction of said two diodes; a signal output line connected to the other end of said capacitor; and a power supply means for applying either a forward or reverse voltage to said rectifier group so that said junction is switched from a comparatively low-impedance state to a high-impedance state or vice versa.

According to a third aspect of the present invention, there is provided an image pickup device comprising: a rectifier group having a first photodiode and a diode connected in series in the same direction; a second photodiode that is connected to the junction of said first photodiode and said diode at an end having the same polarity as said first photodiode; a reading circuit connected to said second photodiode at the other away from said junction; a capacity portion connected in parallel to said second photodiode; and a power supply means for applying a forward or reverse voltage to said rectifier group so that said junction is switched from a comparatively low-impedance state to a high-impedance state or vice versa.

The image pickup device according to the third aspect of the present invention is further characterized in that the ratio between the capacities of the first photodiode and the diode is made generally equal to the ratio between the capacities of the second photodiode and the capacity portion.

In the first and second aspects of the present invention, the impedance that develops at the junction of the rectifiers when the photoelectric transducer is reset is determined by the current that flows under the voltage applied to the rectifier group and by the charging current that flows when the electric charges stored in response to the incidence of light on the photoelectric transducer are released. Hence, if the voltage to be applied to the rectifier group is selected in such a way that a current adequately larger than the charging current will flow, the impedance at the junction of interest can definitely be held at low level in all instances.

If a reverse bias voltage is applied to the rectifier group when the photoelectric transducer is operating in storage mode, the junction of interest will develop a sufficiently high impedance to enable storage of the current from the photoelectric transducer.

In a preferred embodiment, terminals of shift registers are connected to opposite ends of the rectifier groups composing an array of image pickup devices and the voltages to be applied to the opposing ends of the rectifier groups are controlled by pulsed voltages from the output terminals of the respective shift registers in such a way that those voltages are in either a forward or reverse direction with respect to the rectifier groups. An advantage of this embodiment is the ability to perform matrix driving of the image pickup devices.

In the third aspect of the present invention, the second photodiode is reset and operated in a reading mode by causing a current to flow by applying a predetermined forward voltage to the rectifier group. Charges can be stored by applying a predetermined reverse voltage to the rectifier group so that all diodes are reverse biased.

Stated more specifically, the impedance that develops at the junction of the first photodiode and the diode when the second photodiode is reset is determined by the current that flows under the voltage applied to the rectifier group and by the charging current that flows when the electric charges stored in response to the incidence of light on the first and second photodiodes are released. Hence, if the voltage to be applied to the rectifier group is selected in such a way that a current adequately larger than the charging current will flow, the impedance at the junction of interest can definitely be held at low level in all instance without being influenced by the amount of illumination on the second photodiode.

If a reverse bias voltage is applied to the rectifier group when the second photodiode is operating in a storage mode, the junction of interest will develop a sufficiently high impedance to enable storage of the current from the second photodiode.

Since the ratio between the capacities of the first photodiode and the diode is made generally equal to the ratio between the capacities of the second photodiode and the capacity portion, the noise occurring due to the current coming out of the second photodiode to flow into the first photodiode and the diode can be reduced.

DETAILED DESCRIPTION OF THE INVENTION

Figure 1:
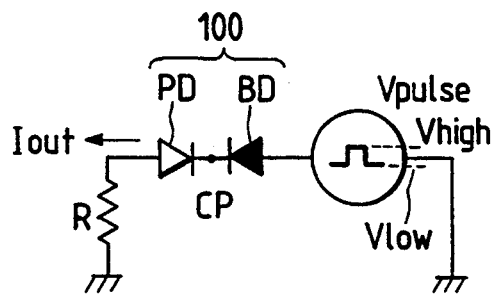
FIG. 1 is an equivalent circuit diagram showing the configuration of prior art image pickup device.
Figure 2:
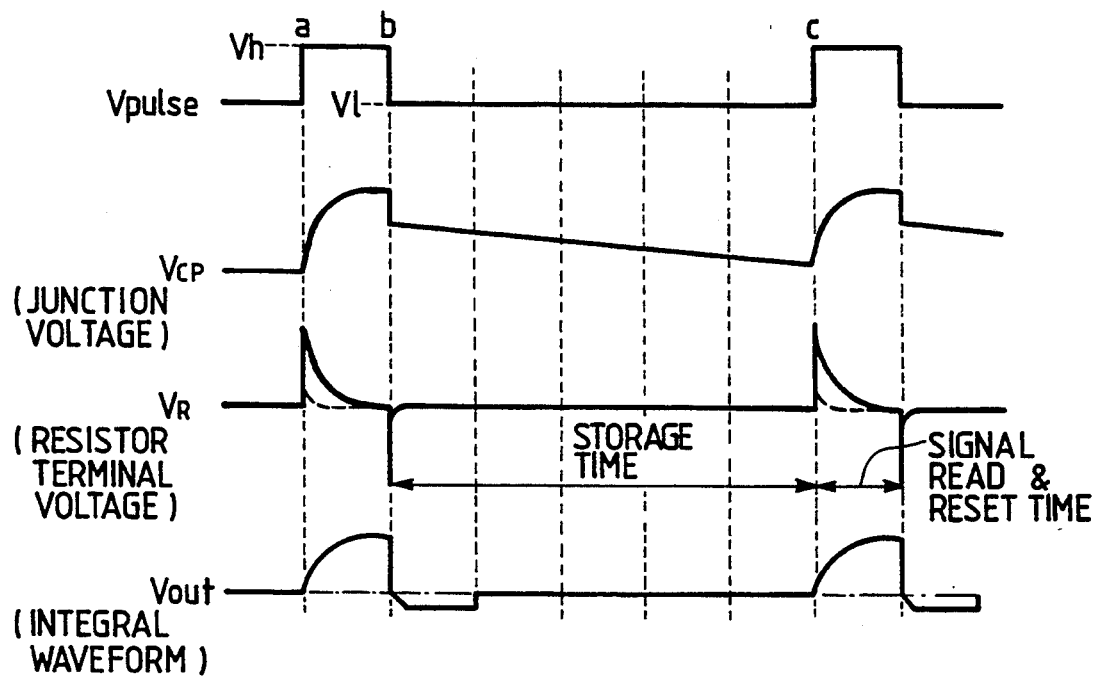
FIG. 2 is a timing chart depicting the reading operation of the image pickup device shown in FIG. 1.
Figure 3:
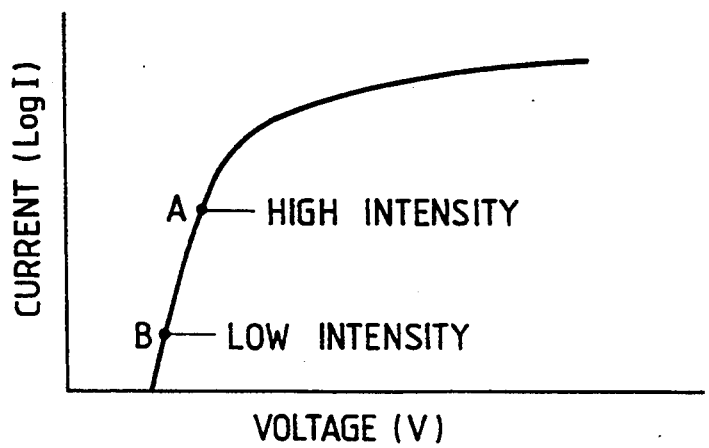
FIG. 3 is a graph showing the current vs voltage characteristic of an amorphous silicon diode.
Figure 4:
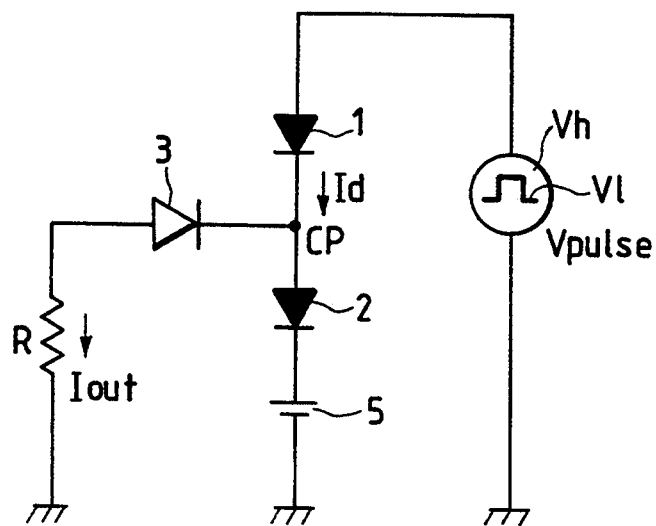
FIG. 4 is an equivalent circuit diagram showing an image pickup device according to an embodiment of the first aspect of the present invention.

An image pickup device according to an embodiment of the first aspect of the present invention is described below with reference to the circuit diagrams shown in FIGS. 4 and 6. As shown in FIG. 4, the cathode of a diode 1 made of an amorphous or polycrystalline semiconductor and the anode of a diode 2 that is also made of an amorphous or polycrystalline semiconductor and which has the same area and structure as diode 1 are connected in series in the same sense to form a rectifier group. Connected to the junction CP of the two diodes is the cathode of a photodiode 3 made of an amorphous or polycrystalline semiconductor, thereby forming an image pickup device 100.

Figure 6:
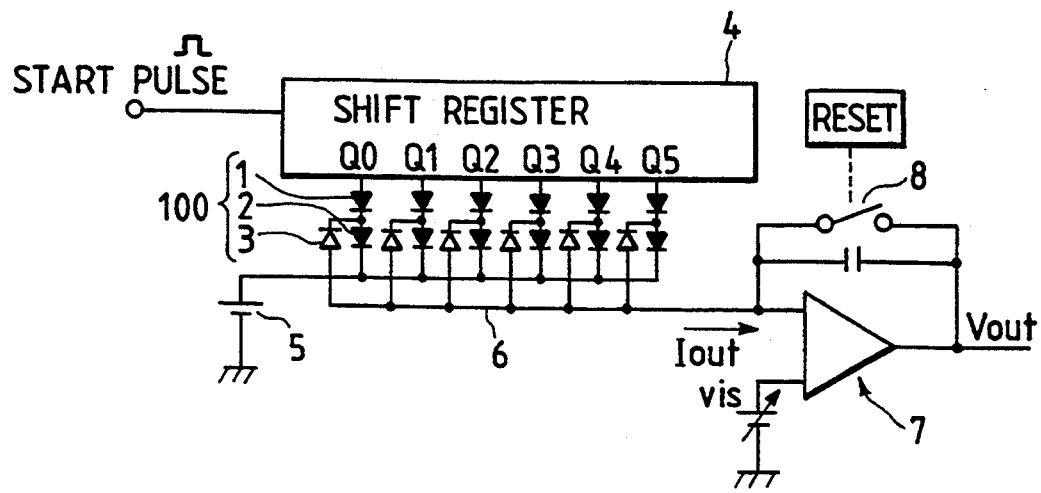
FIG. 6 is an equivalent circuit diagram showing an array of image pickup devices according to another embodiment of the first aspect of the present invention.

As shown in FIG. 6, a plurality of such image pickup devices 100 are juxtaposed in line and the anodes of diodes 1 are connected to output terminals QO-QN, respectively, of a shift register 4. The cathodes of diodes 2 are connected to a single dc power supply 5 per line of image pickup devices at such polarity that the rectifier groups each composed of diodes 1 and 2 will be reverse biased. The anodes of photodiodes 3 are connected to a single common signal output line 6 per line of image pickup devices and the signal output line 6 is connected to an input terminal of an integrator 7. The integrator 7 is resettable by a switch 8 that opens or closes in response to a control signal.

In response to the application of a start pulse, the shift register 4 delivers successive shifted pulses from the output terminals QO-QN. The output pulses assume either a high-level voltage Vh or a low-level voltage Vl that satisfy the relationship $Vl<Vb<Vh$, where Vb is a constant voltage produced from the dc power supply 5.

Figure 5:
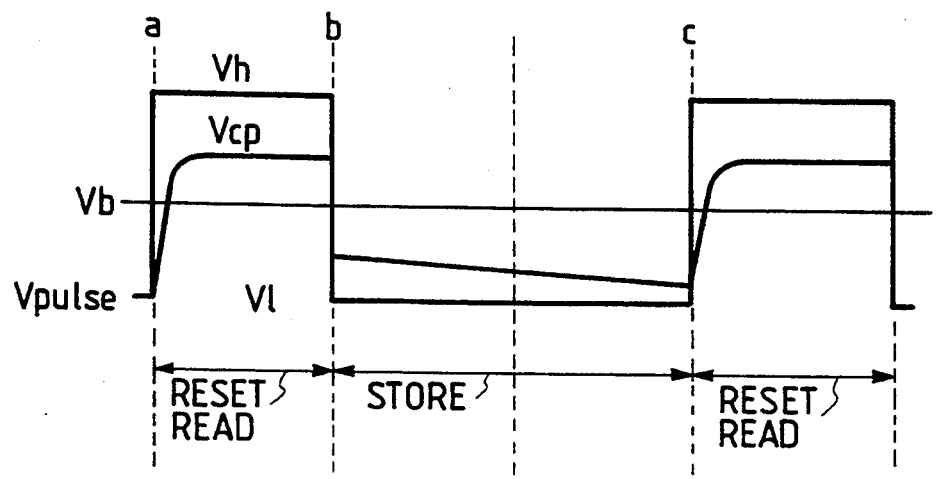
FIG. 5 is a waveform diagram depicting the reading operation of the image pickup device shown in FIG. 4.

The operation of the individual pixels composing the array of image pickup devices is described below with reference to FIGS. 4 and 5. FIG. 5 is a diagram showing the output pulses from the shift register as they are superposed on the waveform of the junction potential.

With pulses being applied from the shift register 4 to the anode of diode 1, high potential Vh and low potential Vl are applied intermittently to the anode. The cathode of diode 2 is normally supplied with a constant voltage Vb that is reverse in polarity to the pulsed voltage and which satisfies the relationship $Vl<Vb<Vh$.

Hence, if the anode of diode 1 assumes high potential Vh at point a in FIG. 5, voltage (Vh−Vb) will be applied in forward direction across the rectifier group composed of diodes 1 and 2, whereupon the two diodes turn on. If the diodes are assumed to have the same equivalent resistance, the potential Vcp at the junction CP is (Vh−Vb)/2 (in reset state).

Then, if the anode of diode 1 assumes low potential Vl at point b, voltage (Vb−Vl) will be applied in reverse direction across the rectifier group composed of diodes 1 and 2, whereupon the two diodes turn off, causing the junction CP to develop high impedance. If the photodiode 3 is illuminated with light under the circumstances, a photocurrent will flow and the potential Vcp starts to decrease toward the ground as a result of discharge (storage time).

At point c after the lapse of a given time, the anode of diode 1 will resume high potential Vh and the diodes 1 and 2 turn on, causing Vcp or the potential at the junction CP to become equal to (Vh−Vb)/2 as in the case already described above. As a result, a charging current Iout (signal current) will flow through a load resistor R. The impedance at the junction CP of rectifiers is determined by Id, or the current flowing under the voltage applied to the rectifier group, and by Iout, or the charging current flowing to an external circuit when the charges stored in response to the incidence of light on the photodiode 3 are released. Therefore, if Vh and Vb, or the voltages to be applied to the rectifier group, are selected in such a way that Id adequately larger than the charging current Iout will flow, the impedance of the junction CP can always be held at a generally constant low level without being influenced by the amount of illumination to the photodiode 3; as a result, the time constant associated with charging is sufficiently reduced to shorten the time required to perform the resetting operation.

Figure 8:
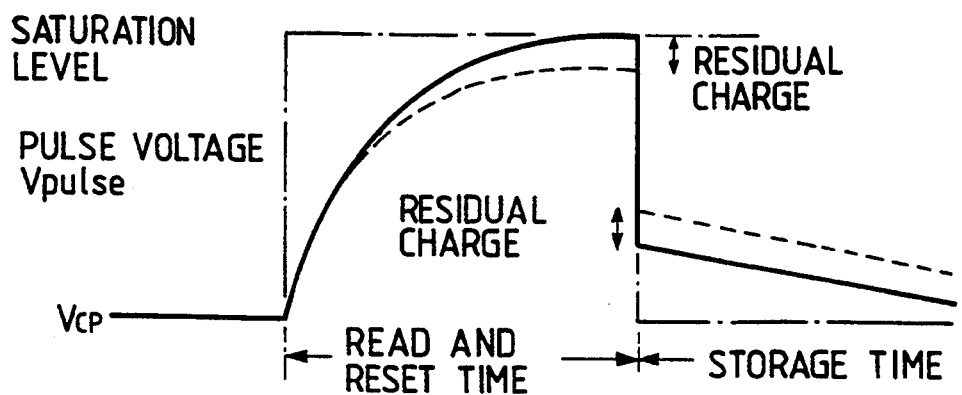
FIG. 8 is a waveform diagram depicting the reading and resetting operation of the image pickup device of the present invention as contrasted with the prior art device.

With the prior art configuration, the time constant is so high that the profile of potential rising due to the charging current draws an upward curve that is indicated by a dotted line in FIG. 8. Thus, the photodiode 3 will not be saturated completely within the pulse duration of pulsed voltage V pulse and the difference from the saturation level yields as residual charges, which will remain during the storage time following the reset time to cause afterimage when the next line is read. In contrast, the embodiment under consideration enables the time constant to be set at an adequately small level and the potential profile will draw an upward curve that is indicated by a solid line in FIG. 8; as a result, the photodiode 3 can be saturated completely within the pulse duration of pulsed voltage Vpulse. Therefore, if the charging current Iout is detected and integrated over time, the amount of exposing light incident on the photodiode 3 can be determined without generating any residual charges.

In the next place, the operation of an array of n image pickup devices is described below with reference to FIGS. 6 and 7 (for the sake of simplicity, the following description assumes the use of six pixels).

Figure 7:
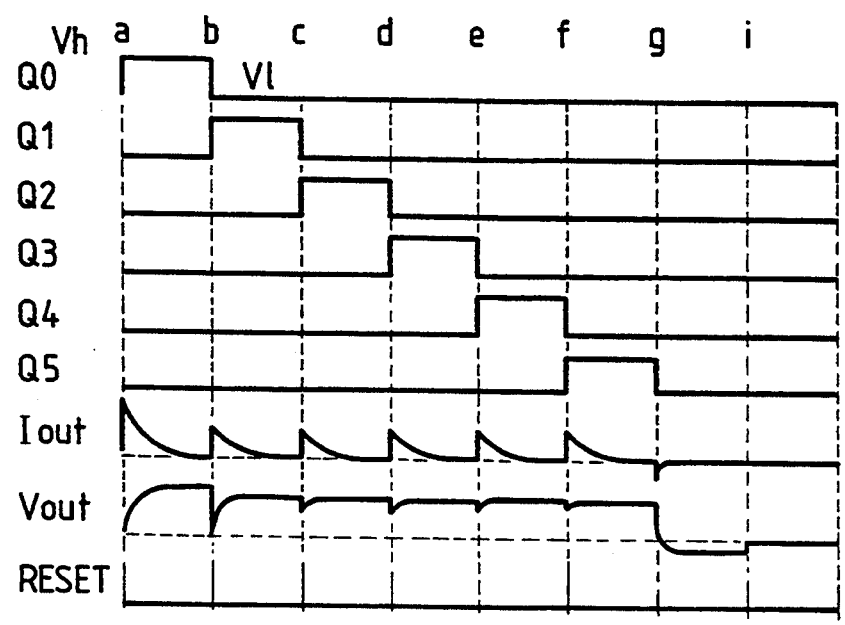
FIG. 7 is a timing chart depicting the reading operation of the array of image pickup devices shown in FIG. 6.

The shift register 4 delivers successive shifted pulses from the respective output terminals Qn (Q0–Q5) as shown in FIG. 7 and, hence, the operation described in the preceding paragraphs is performed over time, producing a signal current Iout (see FIG. 7) to the common signal output line 6. When the individual pulses coming out of the shift register 4 rise, spike noise is superposed on the charging current (signal current) and when those pulses fall, spike noise will appear that has the opposite polarity to the first-mentioned spike noise. However, the noises appearing at the rise and fall times will cancel each other if the fall time of one pulse is allowed to coincide with the rise time of an adjacent pulse. Thus, the signal current Iout is as shown in FIG. 7, where both the spike noise appearing at the rise time of the first pulse from the shift register 4 (which is superposed on the charging current) and the spike noise appearing at the fall time of the sixth pulse (which is delivered downwardly) will be delivered to the common signal output line 6. Therefore, by integrating the signal current Iout over time, one can obtain an integral voltage Vout as shown in FIG. 7. The term "rest" appearing in FIG. 7 denotes the timing of resetting the integrator 7.

Figure 9:
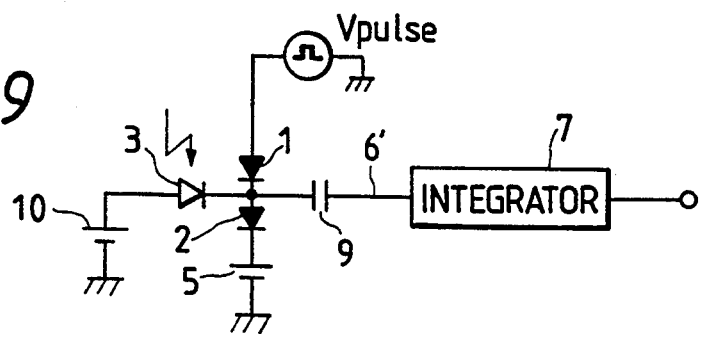
FIG. 9 is an equivalent circuit diagram showing an image pickup device according to still another embodiment of the present invention.

FIG. 9 shows a pixel of image pickup device according to another embodiment of the first aspect of the present invention. The components that are the same as those shown in FIG. 4 are identified by like numerals.

A capacitor 9 is connected at an end to the junction CP whereas the other end of the capacitor 9 is connected to a signal output line 6' which in turn is connected to the integrator 7. The anode of the photodiode 3 is connected to virtually grounded power supply 10 producing voltage Vis for determining the potential at the virtual ground point of an operational amplifier composing the integrator 7. As in the case shown in FIG. 4, the anode of the diode 1 is adapted to be supplied with pulsed voltage.

When the anode of the rectifier group composed of diodes 1 and 2 develops high potential upon application of a pulsed voltage, the charging current due to the charges stored in the photodiode 3 in response to its illumination with light is capacively coupled via the capacitor 9 to produce outputs the average of which can be reduced to zero with reference to the ground.

Figure 10:
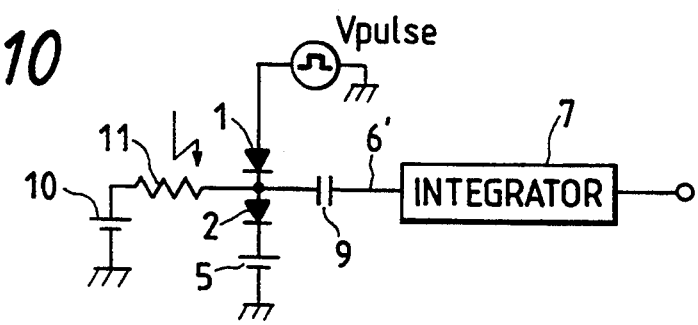
FIG. 10 is an equivalent circuit diagram showing an image pickup device according to yet another embodiment of the present invention.

The embodiment shown in FIG. 10 is the same as the case shown in FIG. 9 except that the photodiode 3 is replaced by a photoconductor 11. The components that are the same as those which are shown in FIG. 9 are identified by like numerals. The photoconductor 11 is a semiconductor device that picks up current by the effect of photoconduction, in which the resistance of the device decreases with the increasing amount of light illumination; the photoconductor 11 operates to perform the same function as the photodiode 3.

Figure 11:
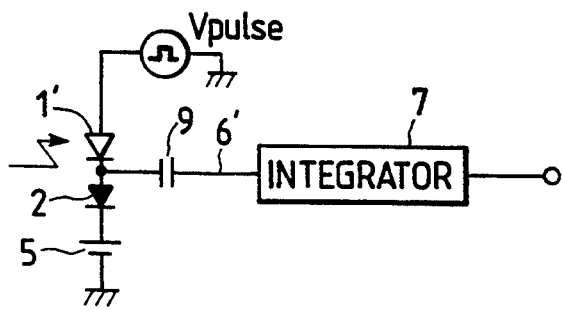
FIG. 11 is an equivalent circuit diagram showing an image pickup device according to an embodiment of the second aspect of the present invention.

FIG. 11 shows an image pickup device according to an embodiment of the second aspect of the present invention, in which one of the two diodes composing the rectifier group which is to be supplied with pulsed voltage Vpulse is replaced by a photodiode. Stated more specifically, the image pickup device of interest comprises a rectifier group having a photodiode 1' and diode 2 (both made of amorphous or polycrystalline semiconductor) connected in series in the same sense, and a capacitor 9 connected to the junction of the two diodes. As in the embodiment shown in FIG. 4, the cathode and the anode of the rectifier group are supplied with a constant voltage Vb and a pulsed voltage, respectively, so that the junction CP is switched from a low-impedance state to a high-impedance state and vice versa, thereby causing either a forward or reverse voltage to be applied to the rectifier group. The embodiment shown in FIG. 11 has the advantage that the number of semiconductor devices composing the image pickup device is sufficiently reduced realize a simple configuration.

Figure 12:
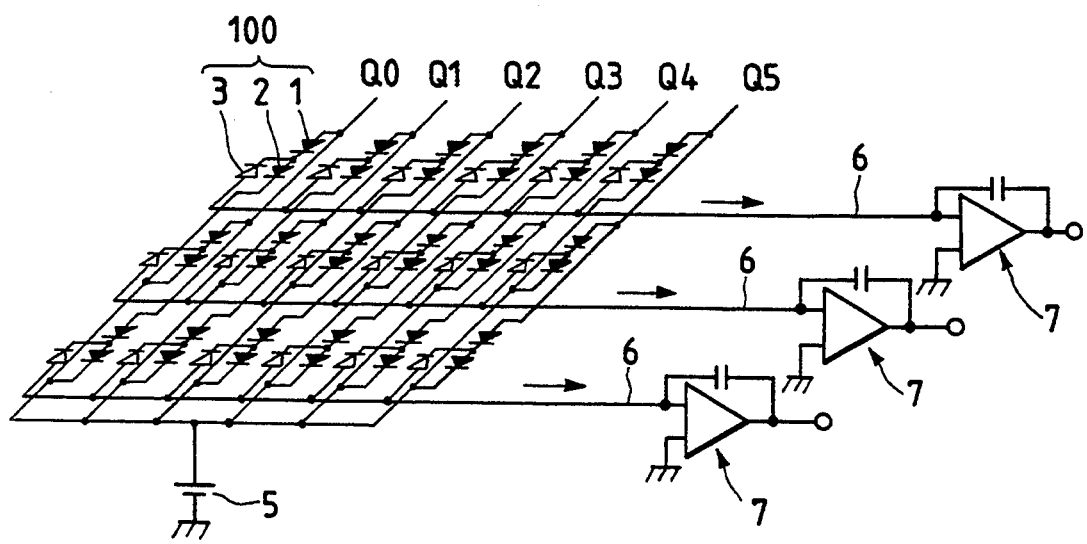
FIG. 12 is an equivalent circuit diagram showing the case where an array of image pickup devices according to the present invention is applied to a 2D sensor.

FIG. 12 shows a 2D sensor assembly in which a plurality of arrays of image pickup devices that are shown in FIG. 6 are arranged in a two-dimensional pattern. The components that are the same as those which are shown in FIG. 6 are identified by like numerals. Signal output lines 6 that are common to the image pickup devices arranged in lines are connected to the virtual ground points of the associated integrators 7, so as to insure that there will be no deterioration of image data due to the capacitive coupling of the respective signal output lines 6. The anodes of the diodes 1 and the cathodes of the diodes 2, which are located at the corresponding positions on the respective lines, are connected by common lines so as to simplify the mechanism of driving the sensor assembly. The photodiodes 3 on the respective lines are connected to a single dc power supply 5 that is common to all lines of interest.

Figure 13:
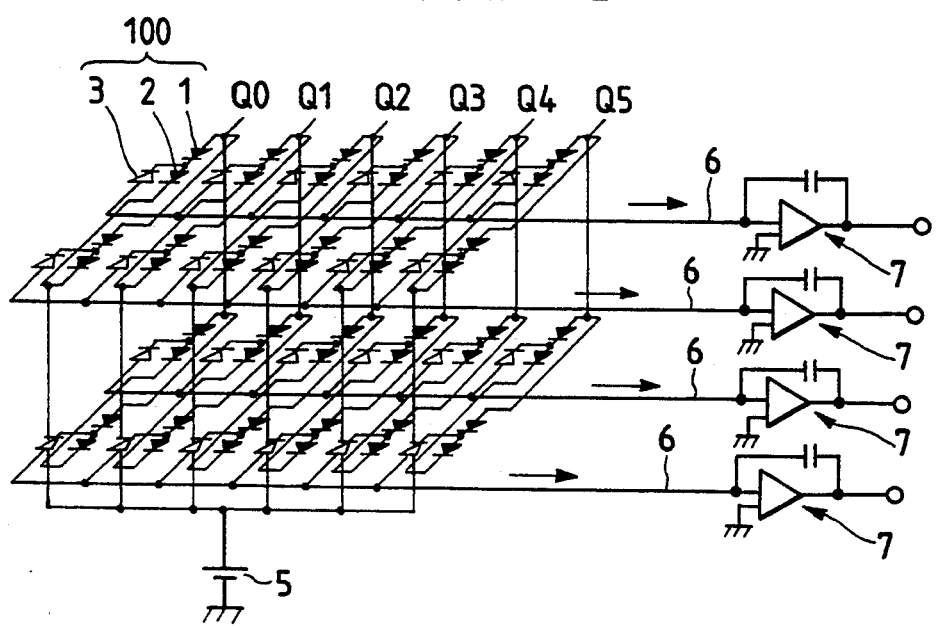
FIG. 13 is an equivalent circuit diagram showing the case where an array of image pickup devices according to the present invention is applied to a 3D sensor.

FIG. 13 shows a 3D sensor assembly in which lines of the image pickup devices shown in FIG. 6 are arranged in two stages for each line. The components that are the same as those which are shown in FIG. 6 are identified by like numerals. The signal output lines 6 for the upper and lower lines are connected to separate integrators 7. The photodiodes 3 on the individual lines arranged in two stages are connected to a single dc power supply 5 that is common to all line of interest.

A specific process for fabricating the 3D sensor assembly under consideration may proceed as follows: first, a 2D sensor is formed on a plurality of transparent substrates (not shown and in the case under consideration, two substrates are used) by the thin-film process and, then, the substrates are placed one on top of another.

To fabricate a 3D sensor assembly having a great depth of focus, one may insure that document surface is allowed to be incident on the surfaces of the individual sensors and that an image signal is selectively produced as output from the sensor surface in focus.

Figure 14:
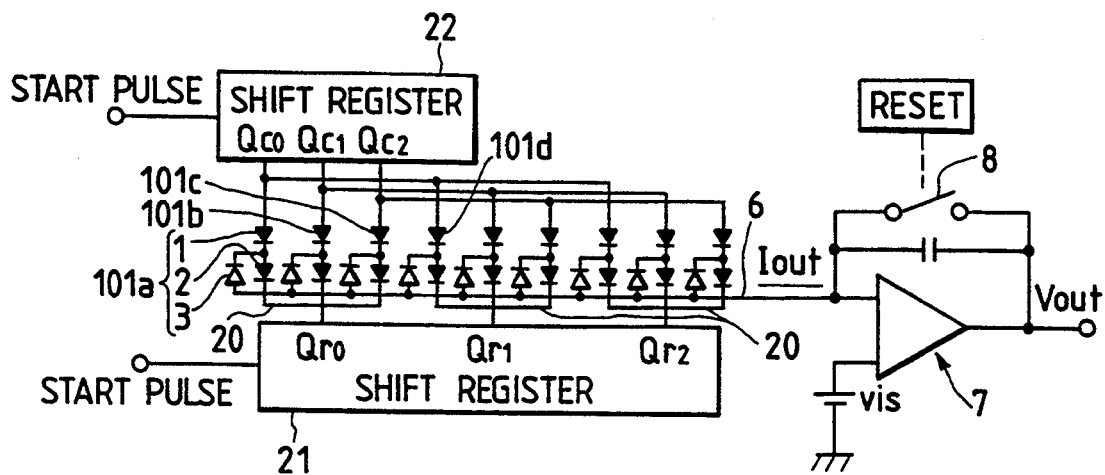
FIG. 14 is an equivalent circuit diagram showing an array of image pickup devices according to another embodiment of the present invention.

FIG. 14 is a circuit diagram showing the composition of an array of image pickup devices that can be operated by matrix driving so as to permit the use of a simplified drive circuit. The image pickup devices 100 themselves have the same composition as the device shown in FIG. 4. The array of the embodiment under consideration is such that a plurality of image pickup devices 100 are juxtaposed (for the sake of simplicity, three image pickup devices are juxtaposed in the embodiment under consideration) to form a block and a plurality of such blocks are arranged to compose the array (for the sake of simplicity, three blocks are arranged in the embodiment under consideration). The cathodes of the rectifier groups in each block of image pickup devices 100 are connected, via a common line 20, to a first shift register 21 at the associated output terminals Qr0–Qr2, the number of which is equal to that of blocks. The anodes of the rectifier groups in each block of image pickup devices 100 are connected to a second shift register 22 at the associated output terminals Qc0–Qc2, the number of which is equal to the number of image pickup devices in each block. The anodes of the photodiodes 3 are connected to a single signal output line 6 per line of image pickup deices, and this signal output line 6 is connected to an input terminal of the integrator 7.

The operation of the aforementioned array of image pickup devices is described below with reference to FIGS. 14 and 15. To begin with, the case is described where the cathodes of the rectifier groups in the first block of image pickup devices are supplied with low-level voltage Vrl as a result of the outputting of low-level voltage Vrl from the terminal Qr0 of the first shift register 21 and high-level voltage Vrh from the other terminals Qr1 and Qr2.

When the first shift register 21 operates, the common line to the first block on the left side of FIG. 14 will assume low-level voltage Vrl. Under the circumstances, the terminals Qc0–Qc2 of the second shift register 22 will successively output high-level voltage Vch, with one output being shifted from the next as shown in FIG. 15.

Figure 15:
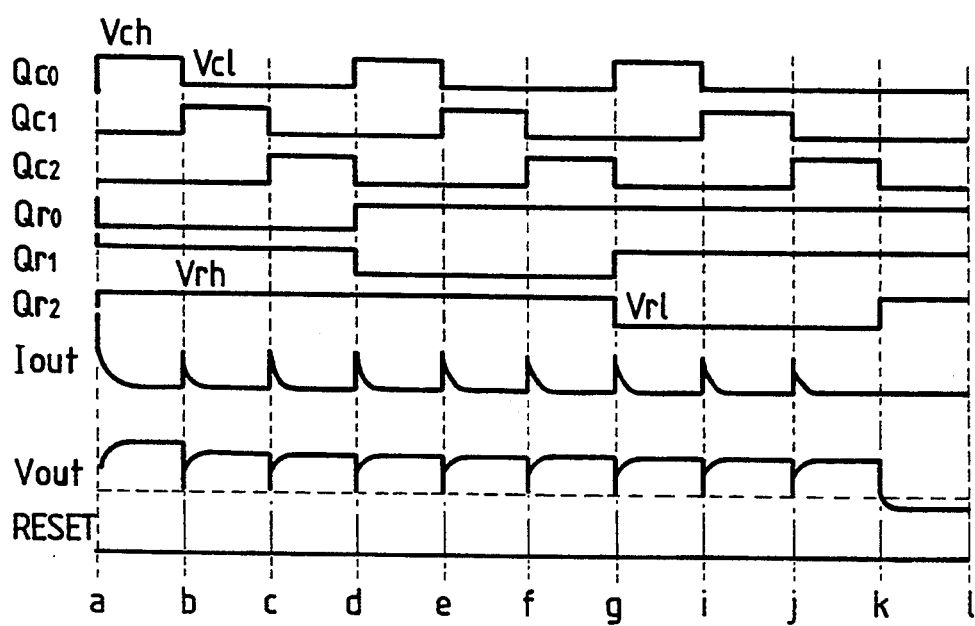
FIG. 15 is a timing chart depicting the reading operation of the array of image pickup devices shown in FIG. 14.

When the anode of diode 1 in image pickup device 101a at the left end of the first block assumes high potential Vch at point a in FIG. 15, a voltage (Vch−Vrl) will be applied in a forward direction across the rectifier group composed of diodes 1 and 2, which will then turn on, causing the potential Vcp at the junction CP to become equal to (Vch−Vrl)/2 (reset state). Under the circumstances, another image pickup device, say, 100b has the anode of the rectifier group assume low potential Vcl, which is lower than the low potential Vrl at the cathode; as a result, the rectifier group is kept reverse biased. At the same time, image pickup device 100d at the left end of the second block develops high potential Vch on the anode of the rectifier group; however, the cathode assumes high potential Vrh which is sufficiently higher than the high potential Vch to insure that the rectifier group is kept reverse biased. Thus, only one of the image pickup devices in the array (in the case under consideration, image pickup device 101a) is brought to a reset state.

Repeating the above-described procedure for all image pickup devices 100 completes the process of scanning for resetting one line. In each of the reset image pickup devices 100, the anode of diode 1 will assume low potential Vcl and voltage (Vrl−Vcl) is applied in a reverse direction across the rectifier group composed of diodes 1 and 2, which will then turn off, causing high impedance to develop at the junction CP. If the photodiode 3 is illuminated with light under the circumstances, a photocurrent will flow and the potential Vcp at the junction CP starts to decrease toward the ground as a result of discharge (storage time).

After the lapse of a given storage time, another reset and reading cycle will start. Let us focus on image pickup device 100a at the left end of the array. The storage time lasts up to point a, where low potential Vrl is applied from output terminal Qr0 of the first shift register 21 to the cathode of diode 2 whereas high potential Vch is applied from output terminal Qc0 of the second shift register 22 to the anode of diode 1, causing forward voltage (Vch−Vrl) to be applied to the rectifier group. As a result, both diodes 1 and 2 will turn on, causing the potential Vcp at the junction CP to become equal to (Vch−Vrl)/2 as in the case already described above.

Under the circumstances, part of the charges lost by discharge during the storage time is converted to voltage as it is supplied to the integrator 7 through the signal output line 6 together with the spike noise that is produced on account of the capacity of the photodiode 3. The resulting output voltage contains the spike noise and, hence, is greater than the inherent value which is free from the spike noise. Further, the impedance that develops at the junction CP of rectifiers in the case under consideration is determined by Id, or the current flowing under the forward voltage (Vch−Vrl) applied to the rectifier group, and by Iout, or the charging current flowing when the charges stored in response to the incidence of light on the photodiode 3 are released. Therefore, if the high potential Vch and the low potential Vrl to be applied to the rectifier group are selected in such a way that Id adequately larger than the charging current Iout will flow, the impedance of the junction CP can always be held at a generally constant low level without being influenced by the amount of illumination to the photodiode 3; as a result, the time constant associated with charging is sufficiently reduced to shorten the time required to perform the resetting operation.

At point b, the cathode of diode 2 is kept supplied with low potential Vrl from output terminal Qr0 of the first shift register 21 whereas low potential Vcl is applied from output terminal Qc0 of the second shift register 22 to the anode of diode 1; since Vrl>Vcl, the rectifier group of the image pickup device will be reverse biased, whereupon the spike noise produced by the capacity of the photodiode 3 will cause charges to be drawn out of the signal output line 6, which is opposite to the case described in the preceding paragraph. At the same time, forward voltage (Vch−Vrl) is applied to the rectifier group of image pickup device 100b and diodes 1 and 2 will turn on, whereupon the spike noise developed by the capacity of photodiode 3 in the image pickup device 100b will flow out into the common signal line 6. Since all units of image pickup device 100 are of the same design and made from the same materials by the same process, the spike noise occurring in image pickup device 100a will cancel the spike noise occurring in adjacent image pickup device 100b and no spike noise will be supplied to the integrator 7. Therefore, only the net charges proportional to the amount of exposing light launched into the photodiode 3 will be supplied from image pickup device 100b into the integrator 7. The operation described above is repeated in the image pickup devices 100a, 100b and 100c of the first block.

At point d, the potential at output terminal Qr0 of the first shift register 21 will change from the low level Vrl to the high level Vrh and, as a result, the spike noise caused by the capacity of all photodiodes 3 in the image pickup devices 100a, 100b and 100c composing the first block will flow out to enter the signal output line 6. At the same time, the potential at output terminal Qr1 of the first shift register 21 will change from the high level Vrh to the low level Vrl and, hence, the spike noise of the nature just described above will cause charges to be drawn out of the signal output line 6. If the number of photodiodes 3 connected to output terminal Qr0 is made equal to the number of photodiodes 3 connected to output terminal Qr1 (i.e., the number of photodiodes 3 in the first block is made equal to that in the second block), the outgoing spike noise will cancel the incoming spike noise effectively, so that no spike noise will be supplied to the integrator 7. When output terminal Qr1 of the first shift register 21 develops low potential Vrl, each of the image pickup devices 100 in the second block will perform the reading (resetting) operation in the same way as the image pickup devices in the first block.

With the above-described procedure being repeated in the respective blocks of interest, all image pickup devices in the array, except image pickup device 101a at the left end, will produce an output that is proportional to the amount of exposing light launched into the photodiodes in image pickup devices 100 of each block. When point k is reached after image pickup device 100 at the right end of the array has completed the reading step, the spike noise that occurs when the potential at output terminal Qc2 of the second shift register 22 changes from the high level Vch to the low level Vcl will not be canceled but will draw charges from the signal output line 6, causing the integrator 7 to produce an output that is opposite in polarity to the output produced at point a. However, at no succeeding points will there be noise that is superposed on the image signal as is observed at point a. The term "reset" appearing in FIG. 15 denotes the timing of resetting the integrator 7.

The image pickup devices in the embodiment described above can be driven as a matrix; therefore, if one focuses on the second shift register connected to the anodes of rectifier groups, the number of pixels that can be driven with one output terminal can be made greater than in the case of shift register 4 shown in FIG. 6. This offers a particular advantage in the case of arranging a number of pixels to make an elongated sensor because the number of drive ICs composed of shift registers can be reduced satisfactorily.

In the embodiment described above, image pickup devices 100 have the composition shown in FIG. 4 but, if desired, they may be replaced by the image pickup devices of the compositions shown in FIGS. 9 to 11.

Figure 16:
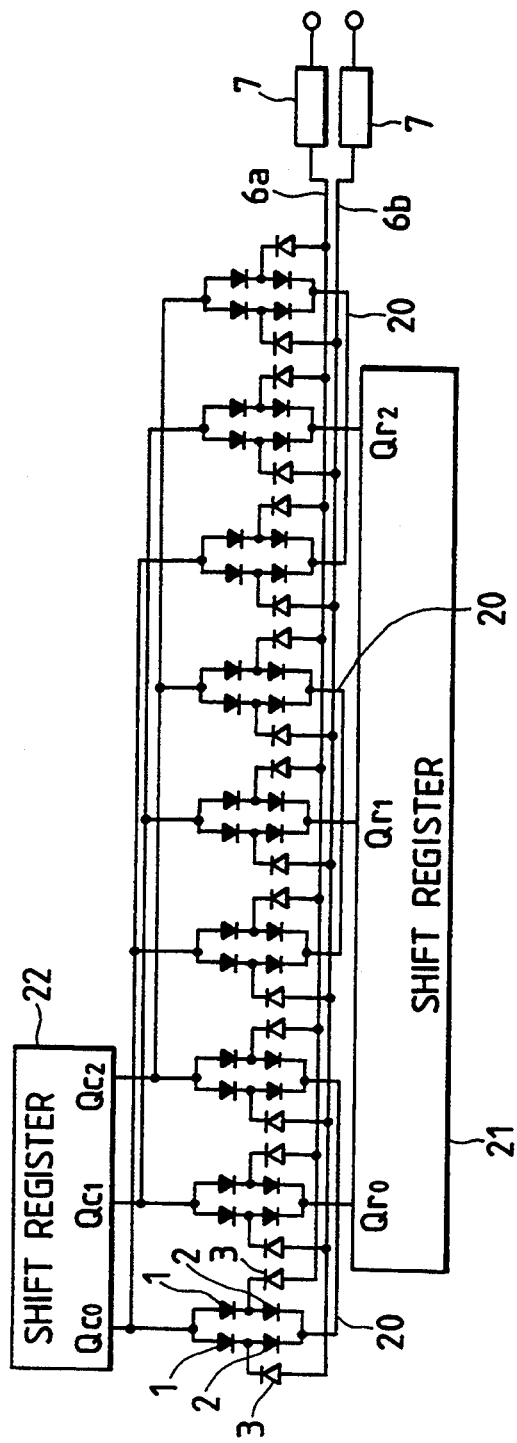
FIG. 16 is an equivalent circuit diagram showing an array of image pickup devices according to yet another embodiment of the present invention.

FIG. 16 shows a matrix-driven array of image pickup devices according to yet another embodiment of the present invention. The components that are the same as those which are shown in FIG. 15 are identified by like numerals.

In the embodiment shown in FIG. 16, the image pickup devices 100 in each block are composed in such a way that two pixels from one group and one group of image pickup devices are connected to a signal output line 6a whereas the other group of image pickup devices are connected to another signal output line 6b. Each of the signal output lines is common to all blocks of interest. An integrator 7 is connected to each of the signal output lines 6a and 6b and image signal from the image pickup devices 100 will be read on the respective signal output lines in the same manner as described in connection with the embodiment shown in FIG. 15. In other words, the two image pickup devices composing one group will simultaneously perform the reading (resetting) operation and, therefore, the embodiment under consideration will retain the advantage of the embodiment shown in FIG. 15 and yet doubles the scan speed, thereby enabling the reading operation to be performed at a higher speed.

Figure 17:
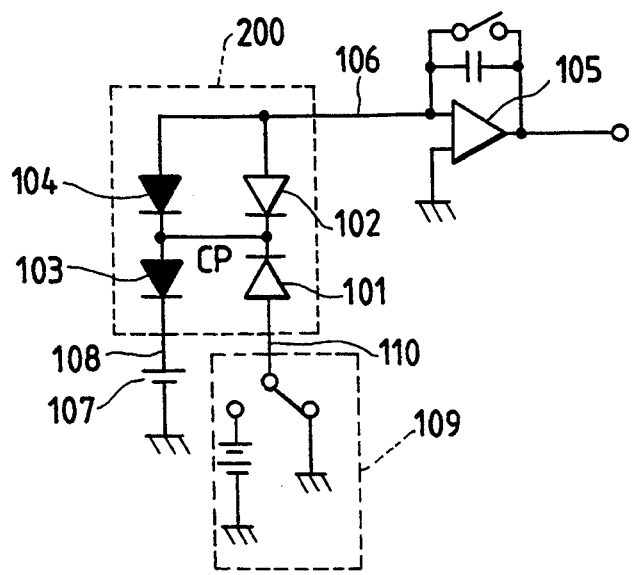
FIG. 17 is an equivalent circuit diagram showing a pixel in an image pickup sensor according to an embodiment of the third aspect of the present invention.

A pixel in an image sensor according to still an embodiment of the third aspect of the present invention is described below with reference to the equivalent circuit diagram FIG. 17.

An image pickup device 200 that composes one pixel is formed of a first photodiode 101, a second photodiode 102 and a diode 103, each being made of an amorphous or polycrystalline semiconductor. The cathode of the first photodiode 101 and the anode of the diode 103 are connected in series in the same sense to form a rectifier group. The cathode of the second photodiode 102 is connected to junction CP of the first photodiode 101 and the diode 103, so that the first photodiode 101 is connected at junction CP to the same polarity of the second photodiode 102.

The other end of the second photodiode 102 which is away from the junction CP is connected via a signal reading line 106 to an integrator 105 for reading a charging current in proportion to the amount of light incident on the second photodiode 102. The cathode of the diode 104 is connected to the junction CP, so that the diode 103 is connected at the junction CP to the reverse polarity of the diode 104, with the other end of the diode 104 which is away from the junction CP being connected to the signal reading line 106. Thus, the diode 104 is connected in such a way that it is parallel to the second photodiode 102. The circuit shown in FIG. 17 is so configured that the ratio between the capacities of the first photodiode 101 and the diode 103 will be generally equal to the ratio between the capacities of the second photodiode 102 and the diode 104.

The cathode of the diode 103 is connected via a bias voltage applying line 108 to a dc power supply 107 that applies a constant voltage Vb for reverse biasing the first photodiode 101, the second photodiode 102, as well as the diodes 103 and 104. The anode of the first photodiode 101 is connected via a pulsed voltage applying line 110 to a pulser 109 for applying pulsed voltage. The constant voltage Vb to be applied from the dc power supply 107 and the high-level voltage Vh and the low-level voltage Vl to be supplied from the pulser 109 are set to satisfy the relationship $|Vl| < |Vb| < |Vh|$. Hence, when the anode of the first photodiode 101 is supplied with the high-level voltage Vh, the junction CP is in a low-impedance state and, when the anode is supplied with the low-level voltage Vl, the junction CP is in a high-impedance state. The diode 104 is normally in a reverse biased state irrespective of whether pulsed voltage is applied or not and, therefore, it will function only as a capacity portion.

A specific structure of the image pickup device under consideration is described below with reference to FIGS. 18, 19 and 20. The first photodiode 101, the second photodiode 102 and the diodes 103 and 104 are each formed of a photoelectric transducer layer that is made of an amorphous or polycrystalline semiconductor and which is sandwiched between a lower electrode made of chromium and an upper electrode made of ITO (indium tin oxide). The photoelectric transducer layer may adopt any structure selected from among pin (nip), in (ni) and pi (ip).

The image pickup device may be fabricated by the following process. First, a chromium film is deposited over an insulating substrate 1 and patterned to form a lower electrode 112 that is common to the first photodiode 101, the second photodiode 102 and the diode 104, a chromium pattern 113 that serves both as the lower electrode of diode 103 and as the bias voltage applying line 108, and a chromium pattern 114 that serves as the pulsed voltage applying line 110.

Subsequently, films of amorphous silicon (a-Si) and ITO are deposited successively and patterned in the same shape to form the photoelectric transducer layer 121 and the upper electrode 131 of the first photodiode 101, the photoelectric transducer layer 122 and the upper electrode 132 of the second photodiode 102, the photoelectric transducer layer 123 and the upper electrode 133 of the diode 103, and the photoelectric transducer layer 124 and the upper electrode 134 of the diode 104. The upper electrode 132 is connected to the upper electrode 134 via a neck 135. The four diodes are formed in such a way as to satisfy the relationship a/c=b/d, where a, b, c and d represent those areas of diodes 101, 102, 103 and 104, respectively, where the lower electrode, the photoelectric transducer layer and the upper electrode overlap. Therefore, the four diodes which are fabricated by the same process are uniform in characteristics and the ratio between the capacities of the first photodiode 101 and the diode 103 when they are reverse biased is equal to a/c whereas the ratio between the capacities of the second photodiode 102 and the diode 104 when they are reverse biased is equal to b/d and, hence, Ca/Cc=Cb/Cd, where Ca, Cb, Cc and Cd denote the capacities of the respective diodes.

Then, an insulating film 140 is deposited over the entire surface and patterned to form contact holes 141, 142, 143, 144 and 145 in the upper electrodes 131, 133, 134, an extension 112a of lower electrode 112 and the chromium pattern 114, respectively. Subsequently, an aluminum film is deposited and patterned to form a signal reading line 151 (106) covering the upper electrode 134, a metallization 152 covering contact holes 141 and 145, and another metallization 153 covering contact holes 142 and 144. Since the upper electrode lying beneath the side of the signal reading line 151 forms the neck 135, errors that would otherwise occur in the area ratios of the diodes if there is an offset in the patterning of the aluminum film can be effectively prevented to assure the necessary precision of working.

Diode 104 has the same structure as the photodiodes 101 and 102 but since the upper electrode 134 is shielded from light by the signal reading line 151, the diode 104 will perform only a rectifying action. Similarly, the upper electrode 133 of the diode 103 is shielded from light by the metallization 153 and, hence, it will perform only a rectifying action.

Being constructed in the way described above, the image pickup device shown in FIG. 18 has the lower electrode 112 common to both the first and second photodiodes 101 and 102, whereby the cathode of the first photodiode 101 is connected to the cathode of the second photodiode 102. The cathode of the second photodiode 102 and the diode 103 are such that the extension 112a of the lower electrode 112 is connected to the clear electrode 133 by the metallization 153 via the contact hole 142 bored in the insulating film 140. The anode of the first photodiode 101 is connected to the chromium pattern 114 (pulsed voltage applying signal line 110) via the metallization 152; the cathode (chromium pattern 113 of the diode 103 is connected to the bias voltage applying line 108, and the anodes of the second photodiode 102 and the diode 104 are connected to the signal reading line 151 (106).

Figure 21:
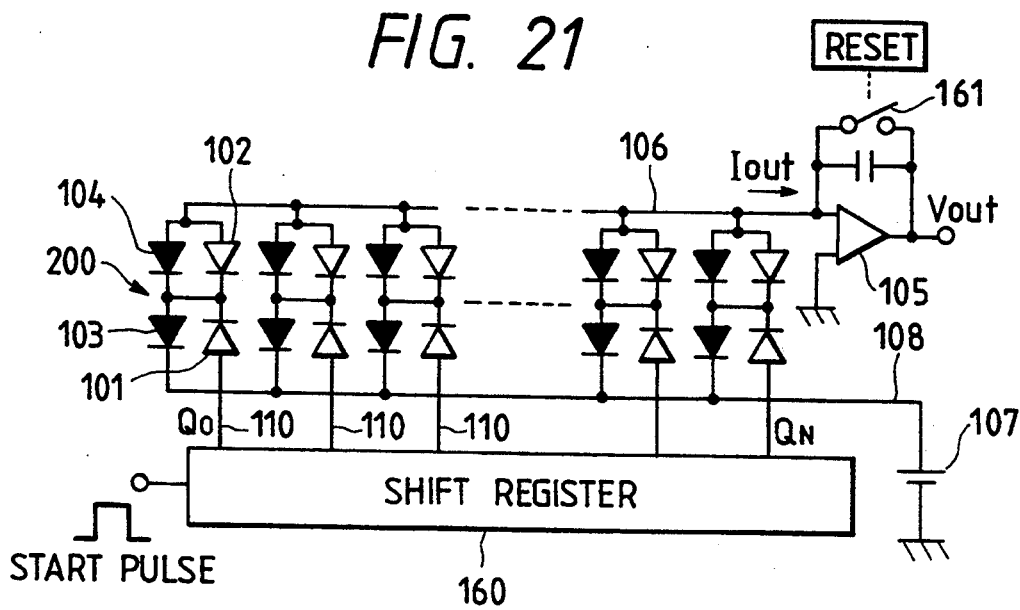
FIG. 21 is an equivalent circuit diagram showing an image sensor according to still another embodiment of the third aspect of the present invention.

As shown in FIG. 21, a plurality of image pickup devices 200 composed in the way described above are juxtaposed in line and the anodes of first photodiodes 101 are connected to output terminals QO–QN, respectively, of a shift register 160 via pulsed voltage applying lines 110. The cathodes of diodes 103 are connected to a single dc power supply 107 per line of image pickup devices at such a polarity that the rectifier groups each composed of the first photodiode 101 and the diode 103 will be reversed biased. The anodes of second photodiodes 102 and diodes 104 are connected to a single common signal reading line 106 per line of image pickup devices and the signal reading line 106 is connected to an input terminal of an integrator 105. The integrator 105 is resettable by a switch 161 that opens or closes in response to a control signal.

In response to the application of a start pulse, the shift register 160 delivers successive shifted pulses from the output terminals QO–QN. The output pulses assume either a high-level voltage Vh or a low-level voltage Vl that satisfy the relationship Vl/Vb/Vh, where Vb is a constant voltage produced from the dc power supply 107.

Figure 22:
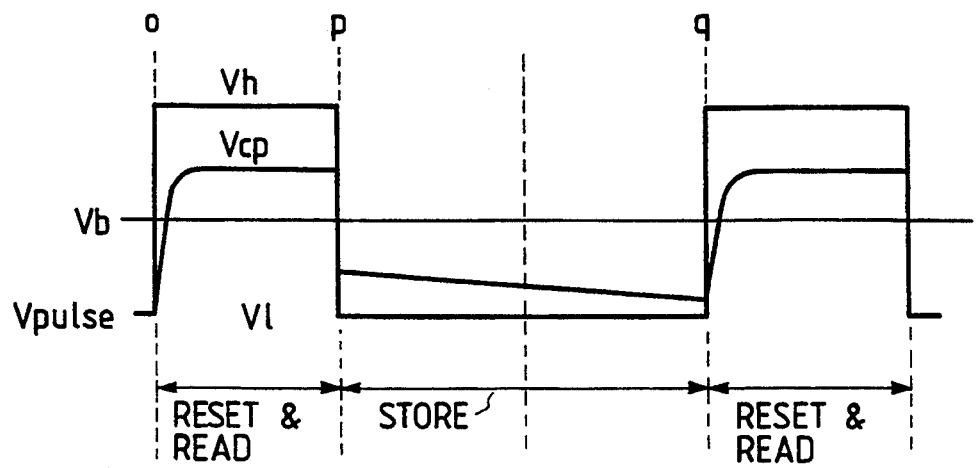
FIG. 22 is a timing chart depicting the operation of a pixel in the image sensor of the present invention.

The operation of the individual pixels composing the array of image pickup devices is described below with reference to FIGS. 17 and 22. FIG. 22 is a diagram showing the output pulses from the shift register 160 as they are superposed on the waveform of the junction potential Vcp.

With pulses being applied from the shift register 160 to the anode of the first photodiode 101, high potential Vh and low potential Vl are applied intermittently to the anode. The cathode of diode 103 is normally supplied with a constant voltage Vb that is reverse in polarity to the pulsed voltage and which satisfies the relationship $|Vl|<|Vb|<|Vh|$.

Hence, if the anode of the first photodiode 101 assumes high potential Vh at point o in FIG. 22, the voltage (Vh−Vb) will be applied in forward direction across the rectifier group composed of the first photodiode 101 and the diode 103, whereupon the first photodiode 101 and the diode 103 turn on. The potential Vcp at junction CP is determined by the equivalent resistance of the first photodiode 101 and the diode 103 (in reset state). Consider, for example, the case where Ca=Cb=Cc=Cd; then, the junction potential Vcp is (Vh−Vb)/2.

In the next step, if the anode of the first photodiode 101 assumes low potential Vl at point p, voltage (Vb−Vl) will be applied in reverse direction across the rectifier group composed of the first photodiode 101 and the diode 103, whereupon the first photodiode 101, the second photodiode 102, the diodes 103 and 104 all function as capacity portion, causing the junction CP to develop high impedance. If the first photodiode 101 and the second photodiode 102 are illuminated with light under the circumstances, a photocurrent will flow and the potential Vcp starts to decrease toward the ground, generating charges in accordance with the area ratios a/c and b/d, which are distributed among the four capacities Ca, Cb, Cc and Ce, in which they are stored (storage state). Since Ca/Cc=Cb/Cd, the charges generated in the first photodiode 101 will be distributed between Ca and Cc whereas the changes generated in the second photodiode 102 will be distributed between Cb and Cd; hence, a voltage balance is achieved, producing no current that will flow out of the rectifier group in the signal line 106.

At point g after the lapse of a given time, the anode of the first photodiode 101 will resume high potential Vh and both the first photodiode 101 and the diode 103 will be forward biased to cause a current flow. Under the circumstances, the potential Vcp at junction CP is determined by the equivalent resistance of the first photodiode 101 and the diode 103, and the second photodiode 102 and the diode 104 are charged at that potential. Since the charging is effected through the integrator 105 which is connected to one end of each the second photodiode 102 and the diode 104, one can read an integral signal Vout in accordance with the charging current Iout. The impedance at junction CP is determined by Id, or the current flowing under the voltage applied to the rectifier group, and by Iout, or the charging current flowing to an external circuit when the charges stored in response to the incidence of light on the second photodiode 102 are released. Therefore, if Vh and Vb, or the voltages to be applied to the rectifier group, are selected in such a way that Id adequately larger than the charging current Iout will flow, the impedance of the junction CP can always be held at a generally constant level without being influenced by the amount of illumination to the second photodiode 102; as a result, the time constant associated with charging is sufficiently reduced to shorten the time required to perform the resetting operation.

Figure 23:
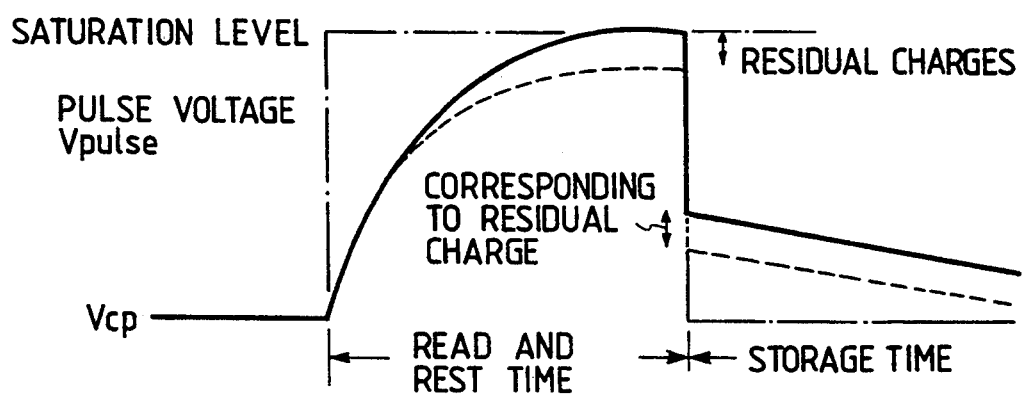
FIG. 23 is a waveform diagram depicting the reading and resetting operation of the image sensor of the present invention, as contrasted with the prior art device.

With the prior art configuration, the time constant is so high that the profile of potential rising due to the charging current draws an upward curve that is indicated by a dotted line in FIG. 23. Thus, the second photodiode 102 will not be saturated completely within the pulse duration of pulsed voltage Vpulse and the difference from the saturation level yields as residual charges, which will remain during the storage time following the reset time to cause image lag when the next line is read. In contrast, the embodiment under consideration enables the time constant to be set at an appropriately low level and the potential profile will draw an upward curve that is indicated by a solid line in FIG. 23; as a result, the second photodiode 102 can be saturated completely within the pulse duration of pulsed voltage Vpulse. Therefore, if the charging current Iout is detected and integrated over time, the amount of exposing light incident on the second photodiode 102 can be determined without causing any residual charges.

In the next place, the operation of an array of an image pickup devices is described below with reference to FIGS. 21 and 24.

Figure 24:
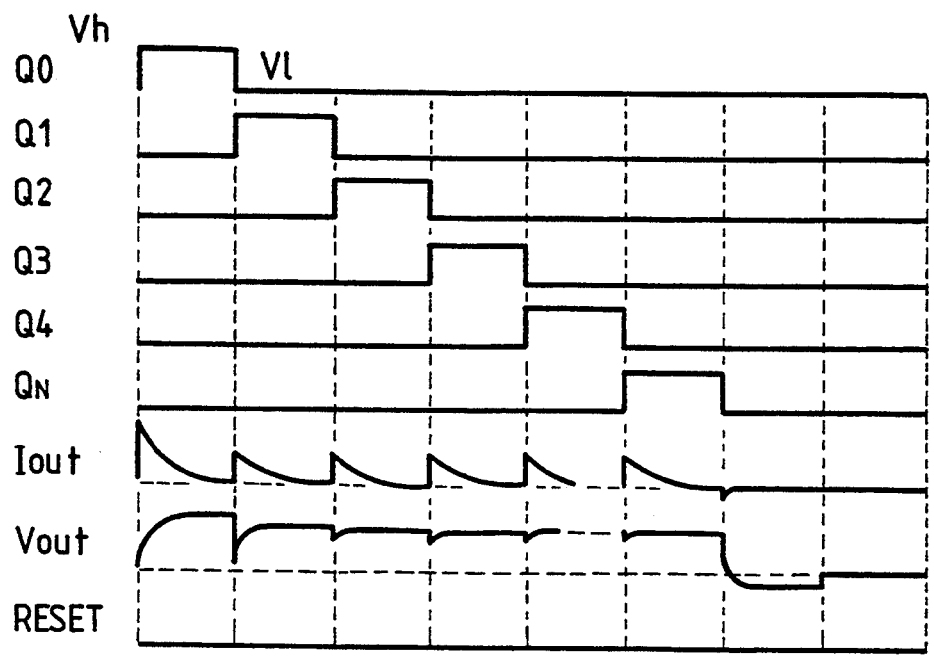
FIG. 24 is a timing chart depicting the reading operation of the image sensor shown in FIG. 21.

The shift register 160 delivers successive shifted pulses from the respective output terminals Qn as shown in FIG. 24 and, hence, the operation described in the preceding paragraphs is performed over time, producing a signal current (charging current) Iout (see FIG. 24) to the common signal reading line 106. When the individual pulses coming out of the shift register 160 rise, spike noise is superposed on the charging current (signal current) and when those pulses fall, spike noise will appear that has the opposite polarity to the first-mentioned spike noise. However, the noises appearing at the rise and fall times will cancel each other if the fall time of one pulse is allowed to coincide with the rise time of an adjacent pulse. Thus, the signal current Iout is as shown in FIG. 24, where both the spike noise appearing at the rise time of the first pulse from the shift register 160 (which is superposed on the charging current) and the spike noise appearing at the fall time of the nth pulse (which is delivered downwardly) will be delivered as output to the common signal reading line 106. Therefore, by integrating the signal current Iout over time, one can obtain an integral output Vout as shown in FIG. 24. The term "reset" appearing in FIG. 24 denotes the timing of resetting the integrator 105 by means of a reset switch 161.

Figure 25:
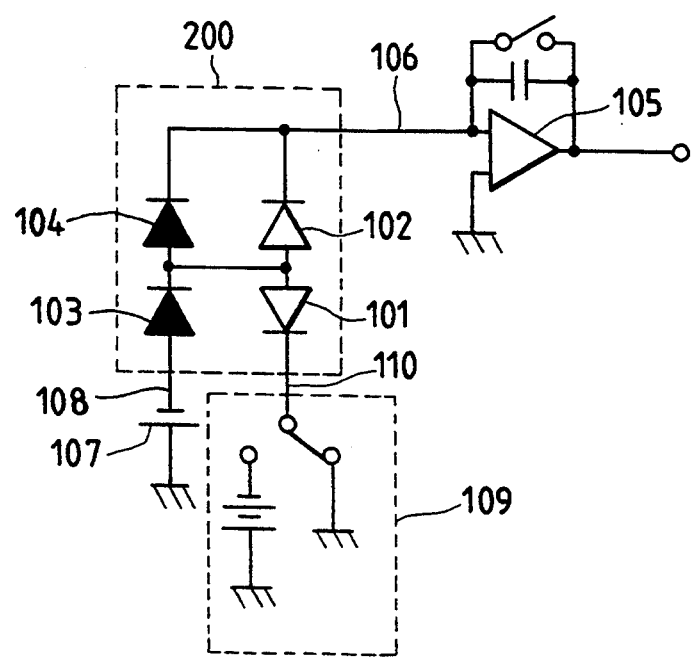
FIG. 25 is an equivalent circuit diagram of a pixel in an image sensor according to yet another embodiment of the third aspect of the present invention.

FIG. 25 shows a pixel in an image pickup device according to yet another embodiment of the present invention. The image pickup device shown in FIG. 25 is essentially the same as the version shown in FIG. 17, except that the first photodiode 101, the second photodiode 102, the diodes 103 and 104 are all connected in opposite directions. The components that are the same as those which are shown in FIG. 17 are identified by like numerals. In the case shown in FIG. 25, the dc current to be applied to the diode 103 and the pulsed voltage to be applied to the first photodiode 101 are also reversed in polarity and the high-level pulsed voltage Vh and the lo-level pulsed voltage Vl are so set that their absolute values satisfy the relationship $|Vl| < |V-b| < |Vh|$, where Vb is a constant voltage applied from the dc power supply 107.

Figure 26A:
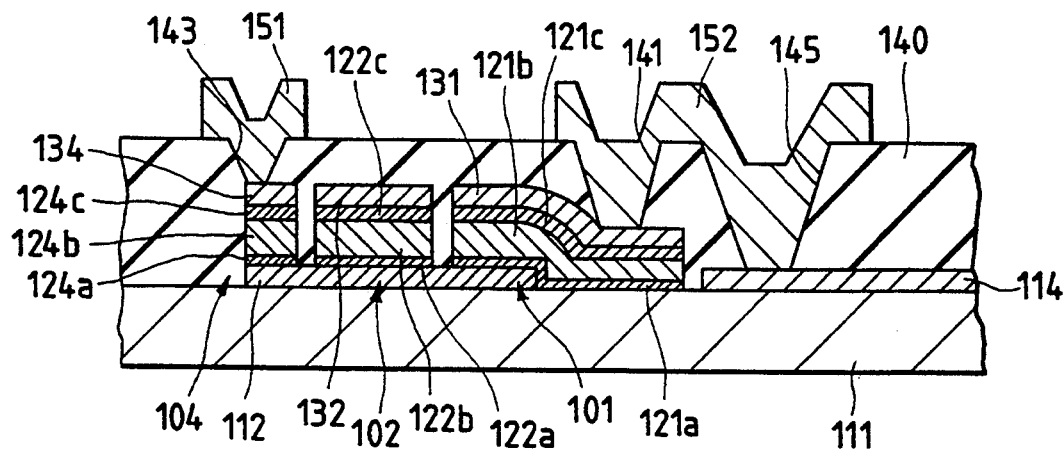
FIGS. 26(a) and 26(b) are cross sections of a pixel in an image sensor according to a further embodiment of the third aspect of the present invention.
Figure 26B:
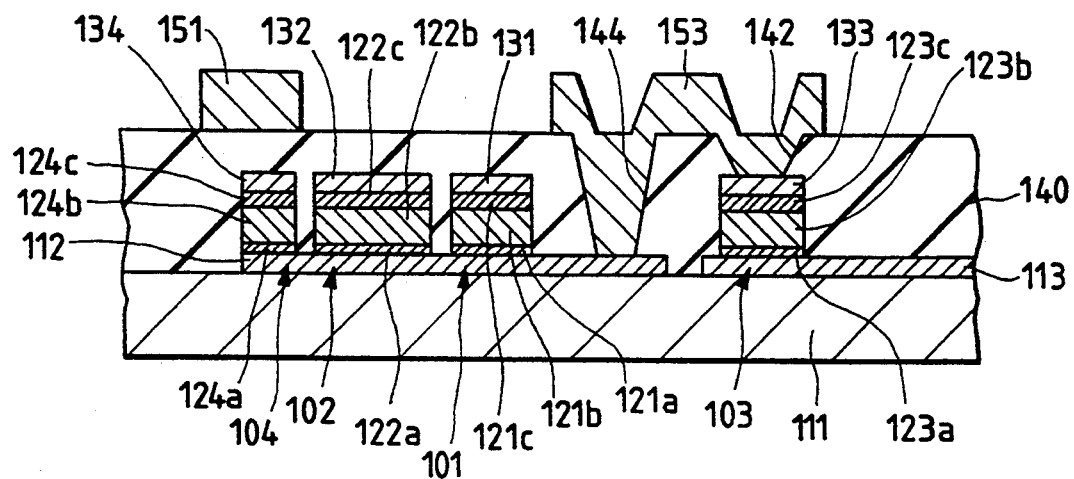

FIGS. 26(a) and 26(b) are cross sections depicting an image sensor according to another embodiment of the third aspect of the present invention. A plan view of the image sensor is essentially the same as shown in FIG. 18 and the components that are the same as those which are shown in FIGS. 18 to 20 are identified by like numerals.

In the embodiment under consideration, the photoelectric transducer layer 121 of the first photodiode 101 is composed of layers 121c, 121b and 121a in order, with the topmost layer 121c being overlaid with an upper electrode 131 that blocks electrons during reverse biasing; the photoelectric transducer layer 122 of the second photodiode 102 is composed of layers 122c, 122b and 122a in order, with the topmost layer 122c being overlaid with an upper electrode 132 that blocks electrons during reverse biasing; the photoelectric transducer layer 123 of the diode 103 is composed of layers 123c, 123b and 123a in order, with the topmost layer 123c being overlaid with an upper electrode 133 that blocks electrons during reverse biasing; and the photoelectric transducer layer 124 of the diode 104 is composed of layers 124c, 124b and 124a in order, with the topmost layer 124c being overlaid with an upper electrode 134 that blocks electrons during reverse biasing. Each of the layers 121, 122c, 123c and 124c is a non-doped a-Si:H layer; each of the layers 121b, 122b, 123b and 124b is an a-Si:H layer doped with phosphorus (P) to provide a specific resistance of at least 1MΩ·cm; and each of the layers 121a, 122a, 123a and 124a is an a-Si:H layer doped with phosphorus (P) to provide a specific resistance of no more than 1 kΩ·cm.

The process of fabricating the image sensor shown in FIG. 26 starts with depositing a chromium film over an insulating substrate 111 and patterned to form a lower electrode 112 which is common to the first photodiode 101, the second photodiode 102 and the diode 104, a chromium pattern 113 serving as the lower electrode of the diode 103 and as the bias voltage applying line 108, and a chromium pattern 114 serving as the pulsed voltage applying line 110. Thereafter, the photoelectric transducer layers 121, 122, 123 and 124 are formed by the following procedure.

Using a gas prepared by doping 100% silane (SiH$_4$) gas with 0.1 to 1% phosphine (PH$_3$) has, a first doped a-Si:H film having a specific resistance of no more than 1K Ω·cm is deposited by plasma-assisted CVD in a thickness of no more than 1000 Å, with the substrate being held at a temperature of 180° to 350° C., so as to insure ohmic contact with the chromium pattern 114.

Then, using a gas prepared by doping 100% (SiH$_4$) gas with no more than 0.01% of phosphine (PH$_3$) gas, a second doped a-Si:H film having a specific resistance of at least 1MΩ·cm is deposited by plasma-assisted CVD, with the substrate being held at a temperature of 180° to 350° C.

Subsequently, a non-doped amorphous silicon (a-Si:H) film is deposited. The total thickness of the second doped a-Si:H film and the non-doped a-Si:H film is 0.3 to 2 μm, with the second doped a-Si:H film being thicker than the non-doped a-Si:H film.

The first doped a-Si:H film, the second doped a-Si:H film and the non-doped a-Si:H film are deposited in successive steps. If each step is to be performed with the vacuum being destroyed before the next step is started, the following method is preferred: the second doped-Si:H film is deposited after removing the oxide film over the first doped a-Si:H film with BHF (buffered hydrofluoric acid), and the non-doped a-Si:H film is deposited after removing the oxide film over the second doped a-Si:H film with BHF.

Figure 18:
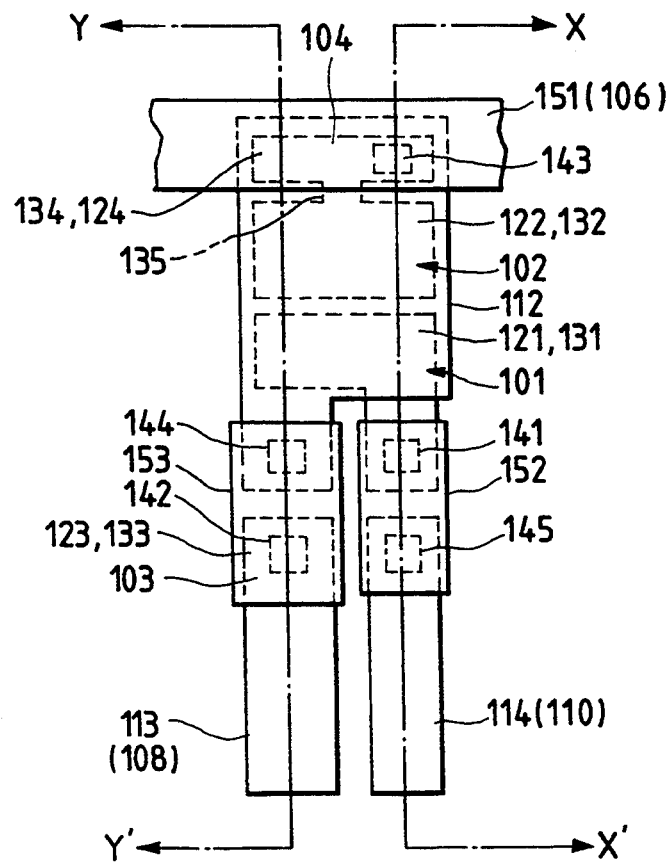
FIG. 18 is a plan view depicting a pixel in an image sensor according to another embodiment of the third aspect of the present invention.
Figure 19:
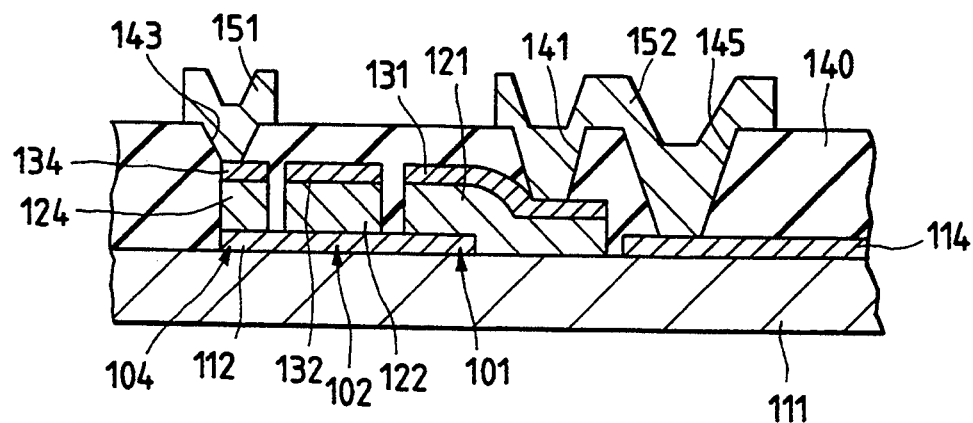
FIG. 19 is a cross section taken on line X—X' of FIG. 18.
Figure 20:
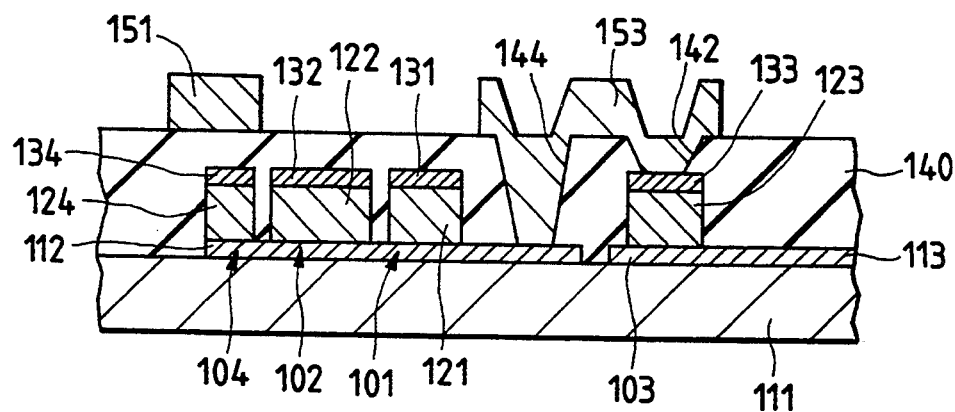
FIG. 20 is a cross section taken on line Y—Y' of FIG. 18.

In the next step, as in the embodiment shown in FIGS. 18 to 20, a film of ITO (indium tin oxide) is deposited in a thickness of 800 Å by sputtering; the ITO film is patterned by photolithography; the non-doped a-Si:H film and the doped a-Si:H films are then patterned by dry etching to form the first photodiode 101, the second photodiode 102 and the diodes 103 and 104. For dry etching the a-Si:H films, a suitable gas such as CF$_4$ or SF$_6$ may be used.

In the embodiment described above, the doped a-Si:H layers 121b, 122b, 123b, and 124b are formed of the second doped a-Si:H film having a specific resistance of at least 1M Ω·cm and, hence, the product of electron mobility and life can be sufficiently increased to insure that a large forward current will flow through the first photodiode 101 and the diode 103 within a short period of time.

Figure 27:
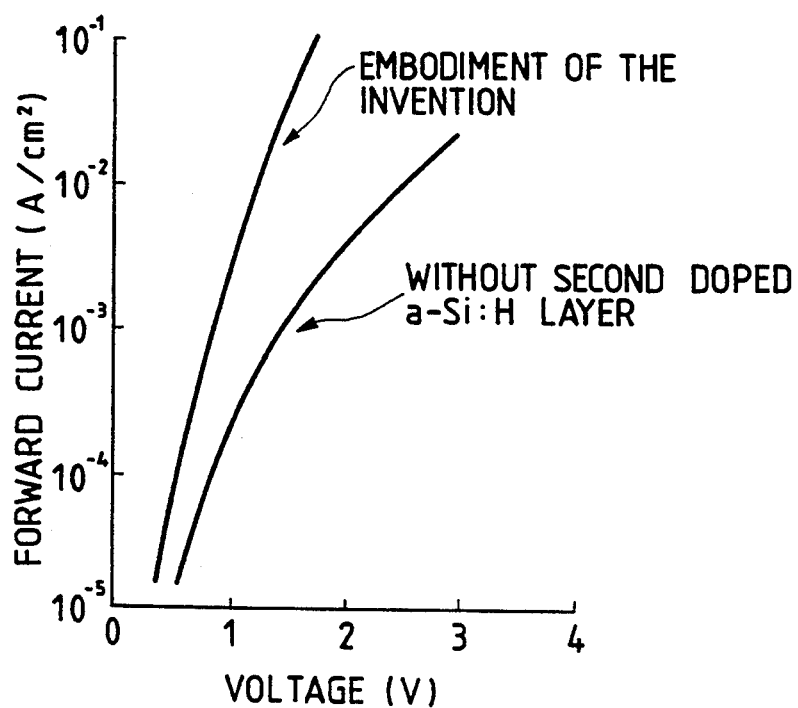
FIG. 27 is a characteristic diagram depicting the forward current flowing through the photodiodes in the embodiment shown in FIG. 26.

Stated more specifically, the diodes fabricated in accordance with the embodiment under consideration permit a greater amount of forward current to flow under a given applied voltage than diodes that do not contain the second doped a-Si:H film (in which the photoelectric transducer layers are solely made from the first doped a-Si:H film having a specific resistance of no more than 1KΩ·cm and the non-doped a-Si:H film, as shown in FIG. 27.

Figure 28:
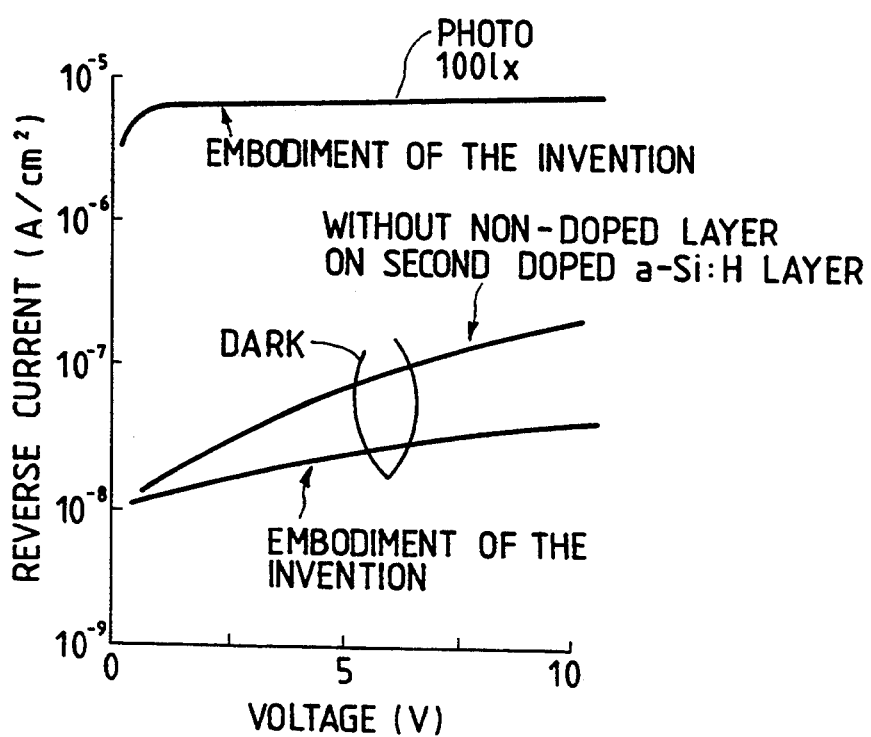
FIG. 28 is a characteristic diagram depicting the reverse current flowing through the photodiodes in the embodiment shown in FIG. 26.

If the photoelectric transducer layers are formed of doped a-Si:H films alone (e.g., the first doped a-Si:H film and the second a-Si:H film), an increased amount of reverse current will flow in the dark as shown in FIG. 28, thus deteriorating the dark current characteristics of the diodes.

In contrast, the photoelectric transducer layers according to the embodiment under consideration have the non-doped a-Si:H layers 121c, 122c, 123c and 124c formed, respectively, just beneath the upper electrodes which block electrons during reverse biasing; hence, the mobility of electrons can be sufficiently reduced to suppress the flow of a dark current through the first photodiode 101, the second photodiode 102, and the diodes 103 and 104, thereby improving the P/D ratio (the ratio of photocurrent to dark current). Consequently, a satisfactory P/D ratio can be maintained while increasing the forward current and, as a result, the image sensor according to the embodiment under consideration will not cause image lag even if it is operated in a fast reading mode.

Figure 29A:
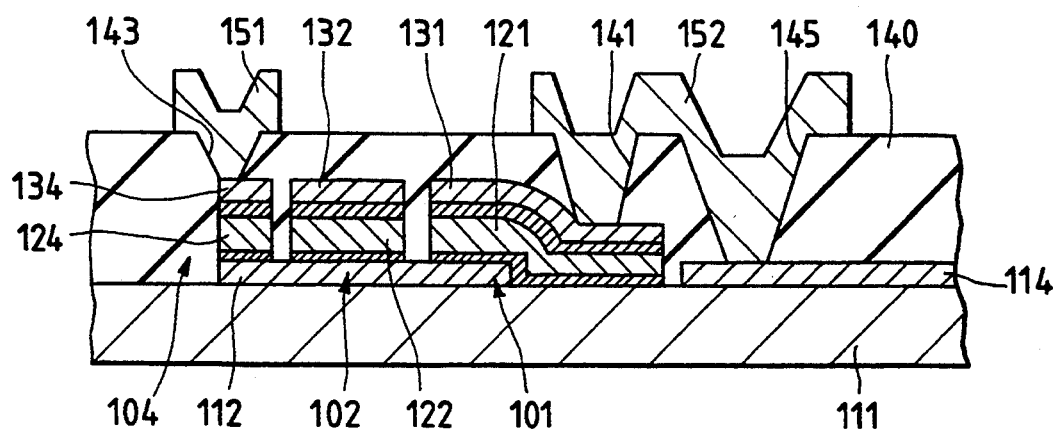
FIGS. 29(a) and 29(b) are cross sections of a pixel in an image sensor according to yet another embodiment of the third aspect of the present invention.
Figure 29B:
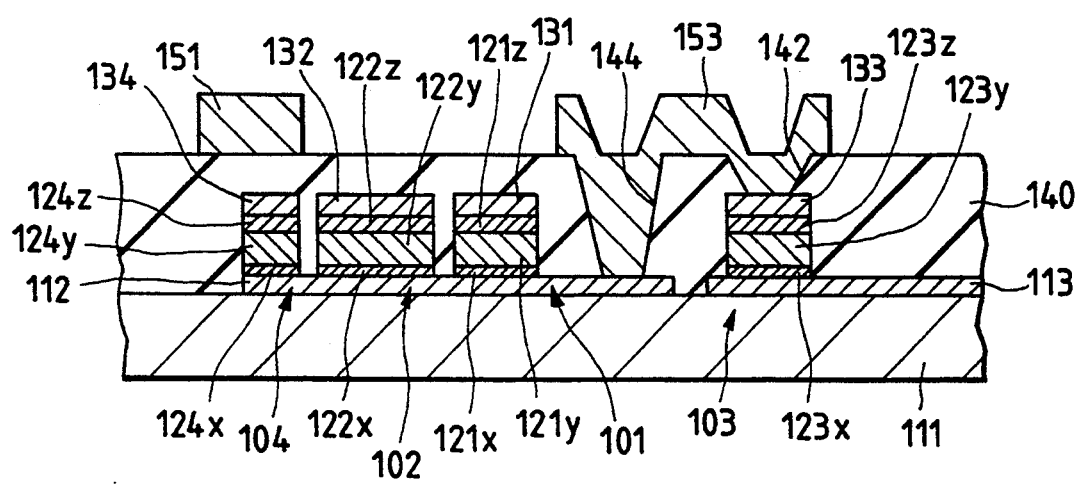

FIGS. 29($a$) and 29($b$) are cross sections depicting an image sensor according to still another embodiment of the third aspect of the present invention. A plan view of the image sensor is essentially the same as shown in FIG. 18 and the components that are the same as those which are shown in FIGS. 18 to 20 are identified by like numerals.

In the embodiment under consideration, the photoelectric transducer layer 121 of the first photodiode 101 is composed of layers 121z, 121y and 121x in order, with the topmost layer 121z being overlaid with an upper electrode 131 that blocks electrons during reverse biasing; the photoelectric transducer layer 122 of the second photodiode 102 is composed of layers 122z, 122y and 122x in order, with the topmost layer 122z being overlaid with an upper electrode 132 that blocks electrons during reverse biasing; the photoelectric transducer layer 123 of the diode 103 is composed of layers 123z, 123y and 123x in order, with the topmost layer 123z being overlaid with an upper electrode 133 that blocks electrons during reverse biasing; and the photoelectric transducer layer 124 of the diode 104 is composed of layers 124z, 124y and 124x in order, with the topmost layer 124z being overlaid with an upper electrode 134 that blocks electrons during reverse biasing. The layers 121z, 122z, 123, and 124z are non-doped a-Si:H layers that are deposited at a temperature different than another group of non-doped a-Si:H layers 121y, 122y, 123y and 124y (the first-mentioned group of non-doped a-Si:H layers are deposited at a lower temperature than the second-mentioned group of non-doped a-Si:H layers). Underlying non-doped a-Si:H layers 121y, 122y, 123y and 124y are a-Si:H layers 121x, 122x, 123x and 124x that are doped with phosphorus (P).

The process of fabricating the image sensor shown in FIG. 29 starts with depositing a chromium film over an insulating substrate 111 and patterned to form a lower electrode 112 which is common to the first photodiode 101, the second photodiode 102 and the diode 104, a chromium pattern 113 serving as the lower electrode of the diode 103 and as the bias voltage applying line 108, and a chromium pattern 114 serving as the pulsed voltage applying line 110. Thereafter, the photoelectric transducer layers 121, 122, 123 and 124 are formed by the following procedure.

Using a gas prepared by doping 100% silane (SiH$_4$) gas with 1% phosphine (PH$_3$) gas, a doped a-Si:H film is deposited by plasma-assisted CVD in a thickness of 1000 Å, with the substrate being held at a temperature of 180° to 350° C.

Subsequently, a first non-doped a-Si:H film and a second non-doped a-Si:H film are deposited at different substrate temperatures to give a total thickness of 0.3 to 2 μm. For the deposition of the first non-doped a-Si:H film, the substrate temperature is 230° to 350° C., whereas for the deposition of the second non-doped a-Si:H film, the substrate temperature is set at 180° to 250° C., which is lower than in the case of the first non-doped a-Si:H film, so that the first non-doped a-Si:H film will become thicker than the second non-doped a-Si:H film.

The first and second non-doped a-Si:H films are typically deposited in two continuous reactors having different temperatures. If they are to be formed in a single reactor, a sufficient time may be provided for the substrate temperature to decrease to the set value within the reactor; if the vacuum in the reactor is destroyed for temperature change after depositing the first non-doped a-Si:H film the oxide film on the first non-doped a Si:H film is preferably removed with BHF (buffered hydrofluoric acid) before the second non-doped a-Si:H film is deposited.

In the next step, as in the embodiment shown in FIGS. 18 to 20, a film of ITO (indium tin oxide) is deposited by sputtering in a thickness of 800 Å; the ITO film is patterned by photolithography; the first and second non-doped a-Si:H films and the doped a-So:H film are then patterned by dry etching to form the first photodiode 101, the second photodiode 102, and the diodes 103 and 104. For dry etching the a-Si:H films, a suitable gas such as CF$_4$ or SF$_6$ may be used.

In the embodiment described above, each of the non-doped a-Si:H layers 121y, 122y, 123y and 124y is deformed of the first non-doped a-Si:H film that has been deposited at a comparatively high temperature; the interfacial layer of the films thus formed have low localization levels and, hence, a large amount of forward current can be permitted to flow through the first photodiode 101 and the diode 113 within a short period of time.

Figure 30:
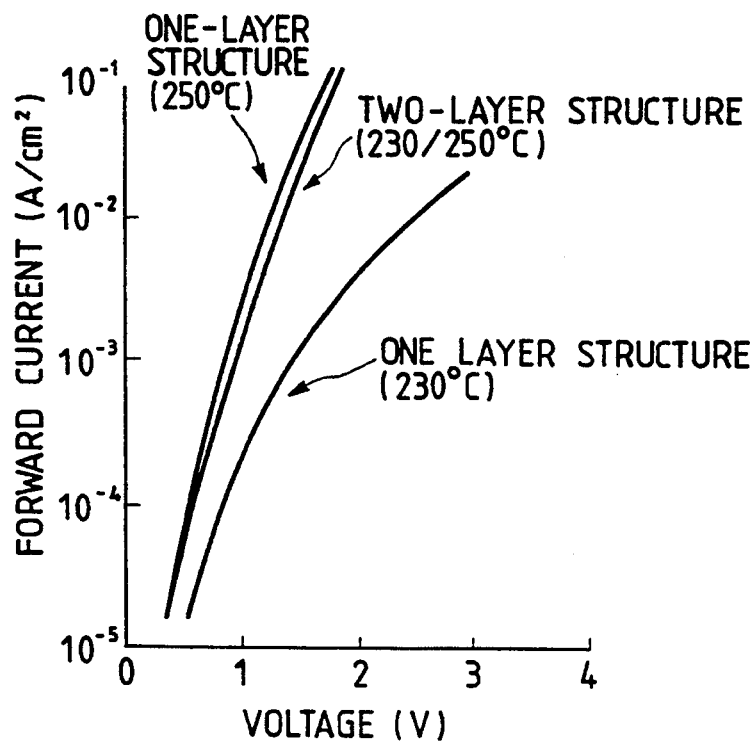
FIG. 30 is a characteristic diagram depicting the forward current flowing through the photodiodes in the embodiment shown in FIG. 29.

Stated more specifically, the diodes fabricated in accordance with the embodiment under consideration (as having two non-doped a-Si:H layers deposited at different substrate temperatures of 250° C. and 230° C.) permit a greater amount of forward current to flow under a given applied voltage than diodes that are formed of a single non-doped s-Si:H layer that has been deposited at a substrate temperature of 230° C. (in which the photoelectric transducer layers are made from the doped a-Si:H film and the second non-doped a-Si:H film), as shown in FIG. 30.

Figure 31:
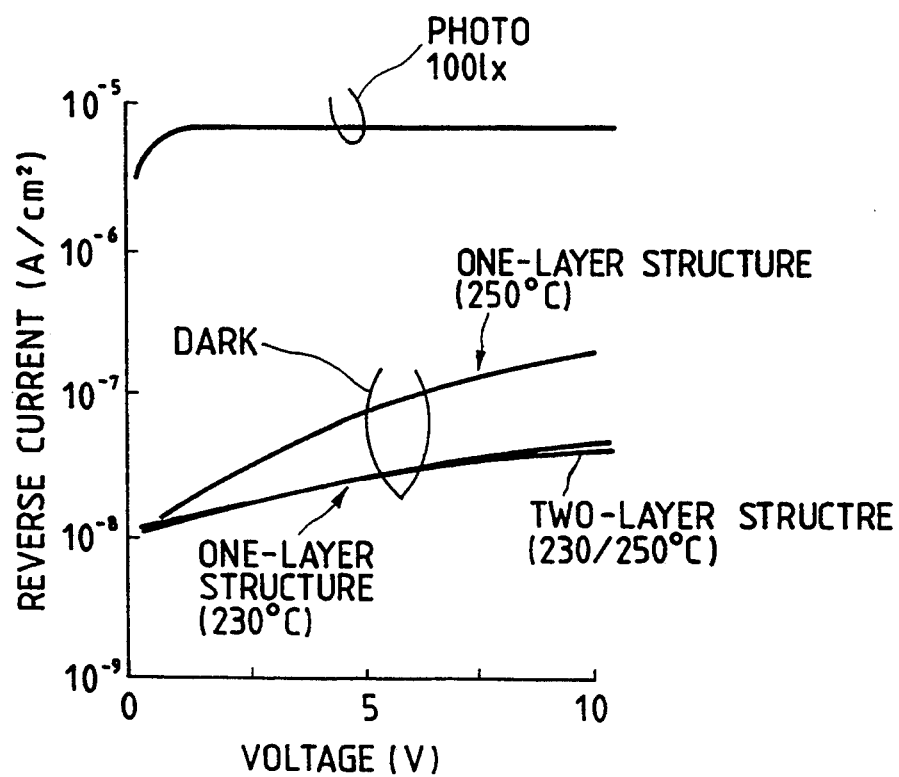
FIG. 31 is a characteristic diagram depicting the reverse current flowing through the photodiodes in the embodiment shown in FIG. 29.

If the photoelectric transducer layers are solely formed of the non-doped a-Si:H film deposited at a substrate temperature of 250° C., and increased amount of reverse current will flow in the dark as shown in FIG. 31, thus deteriorating the dark current characteristics of the diodes. In contrast, the photoelectric transducer layers according to the embodiment under consideration have the non-doped a-Si:H layers 121z, 122z, 123z, and 124z formed, respectively, at 230° C. just beneath the upper electrodes which block electrons during reverse biasing; hence, the height of barrier against the ITO film is sufficiently increased at the interface between ITO and silicon to suppress the flow of a dark current through the first photodiode 101, the second photodiode 102, and the diodes 103 and 104, thereby improving the P/D ratio (the ratio of photocurrent to dark current). As FIG. 31 shows, the dark current characteristics obtained are comparable to the case where photoelectric transducer layers are formed solely of a non-doped a-Si:H film deposited at a substrate temperature of 230° C. Consequently, a satisfactory P/D ratio can be maintained while increasing the flow of forward current and, as a result, the image sensor according to the embodiment under consideration will not cause any image lag even if it is operated in a fast reading mode.

Figure 32:
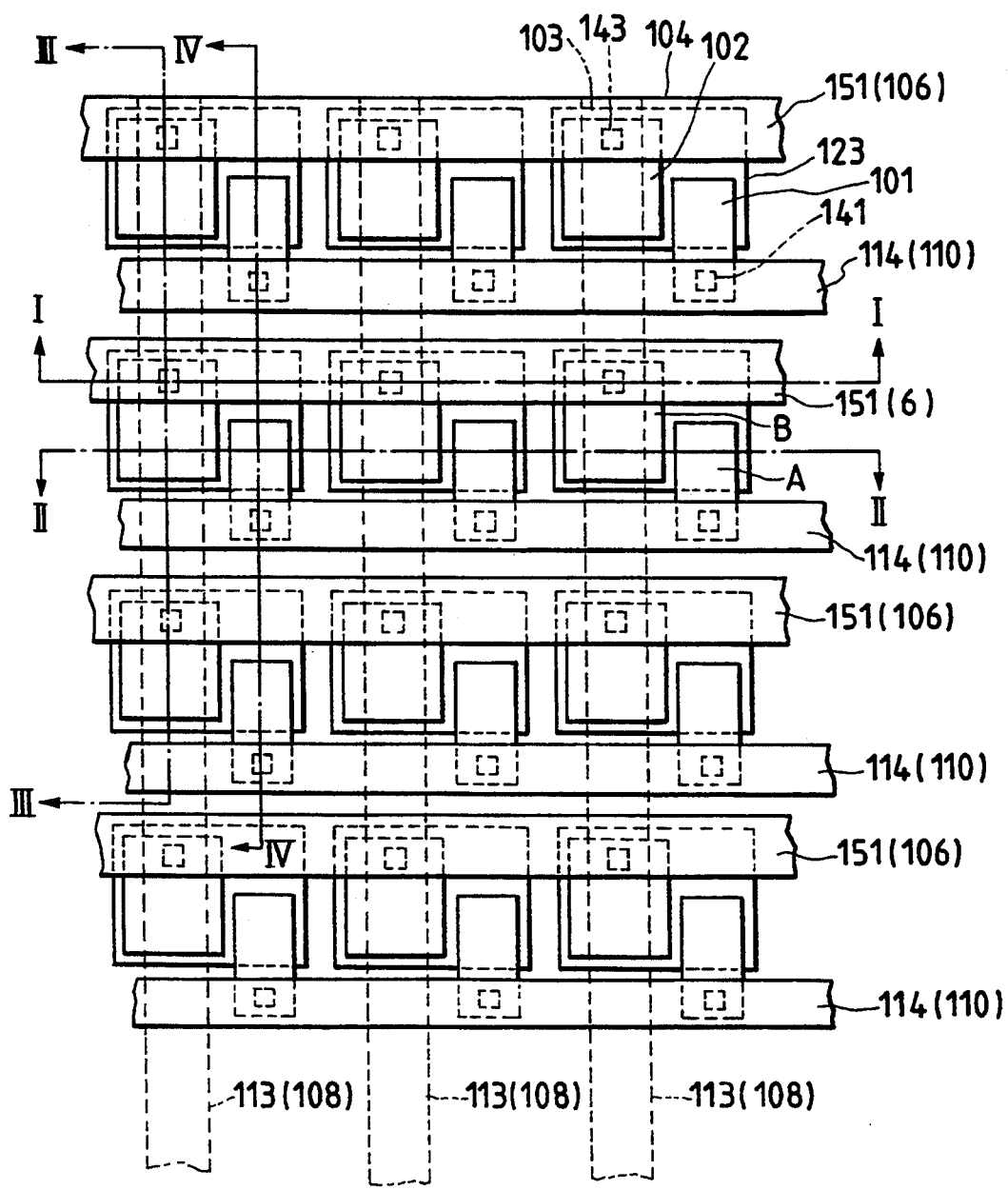
FIG. 32 is a plan view depicting a further embodiment of the third aspect of the present invention as it is applied to a color image sensor.
Figure 33A:
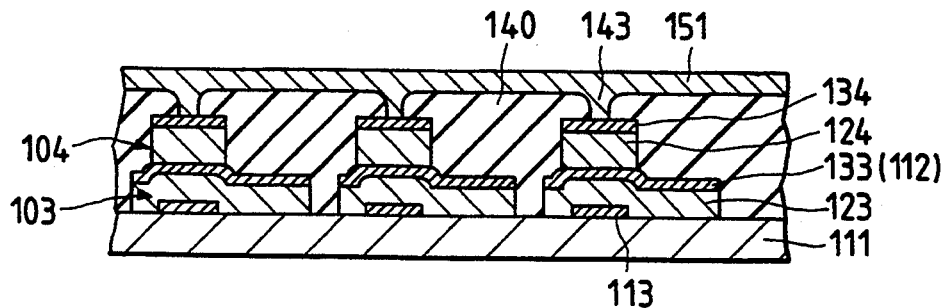
FIG. 33(a) is a cross section of the color image sensor shown in FIG. 32 as it is taken on line I—I of FIG. 32.
Figure 33B:
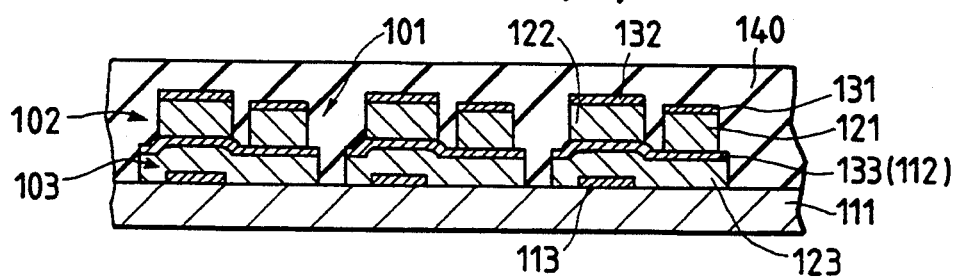
FIG. 33(b) is a cross section of the same color image sensor as taken on line II—II of FIG. 32.
Figure 33C:
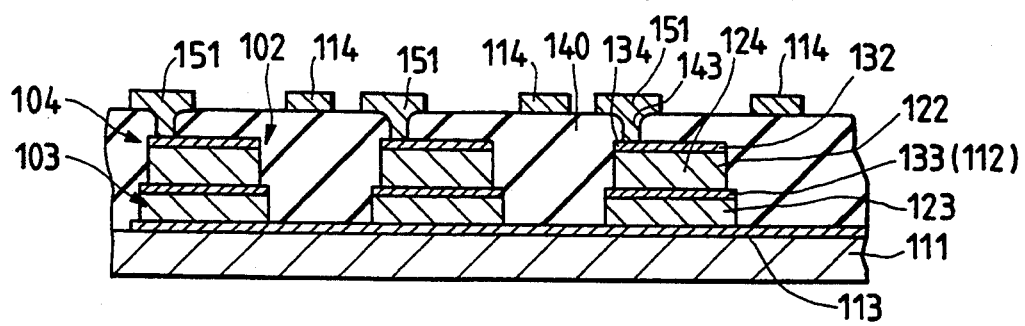
FIG. 33(c) is a cross section of the same color image sensor as taken on line III—III of FIG. 32.
Figure 33D:
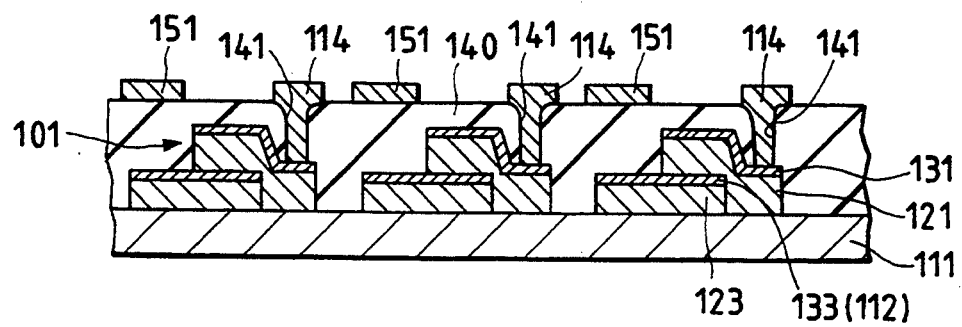
FIG. 33(d) is a cross section of the same color image sensor as taken on line IV—IV of FIG. 32.

FIGS. 32 and 33 show a further embodiment of the present invention as it is applied to a two-dimensional (2D) color image sensor.

Figure 34:
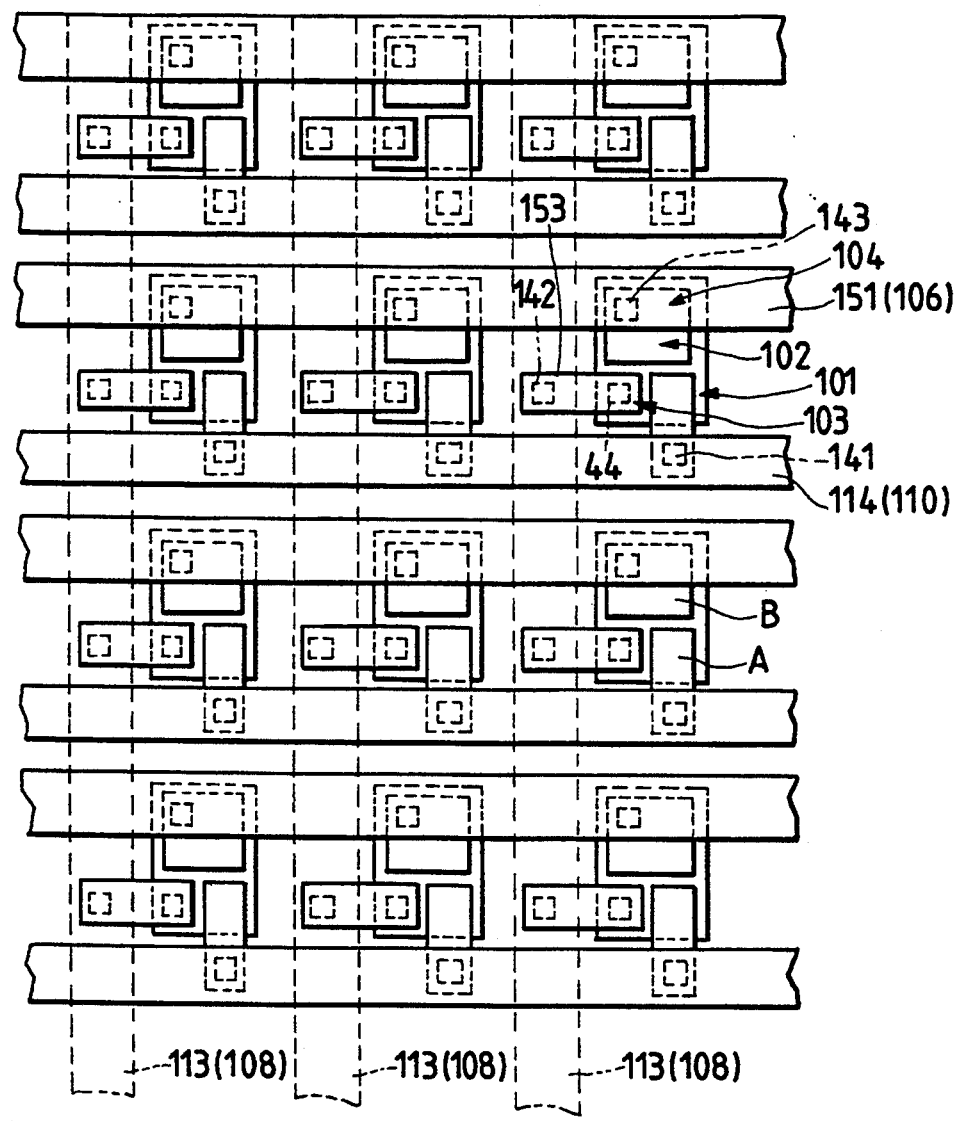
FIG. 34 is a plan view of a color image sensor in which a plurality of image sensors of the configuration shown in FIG. 18 are arranged two-dimensionally.
Figure 35:
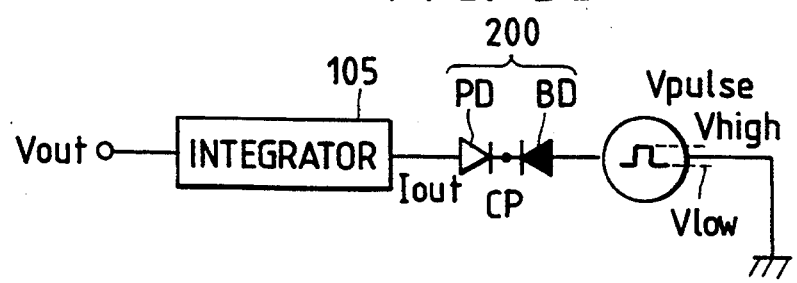
FIG. 35 is an equivalent circuit diagram showing the composition of a pixel in a prior art image sensor.
Figure 36:
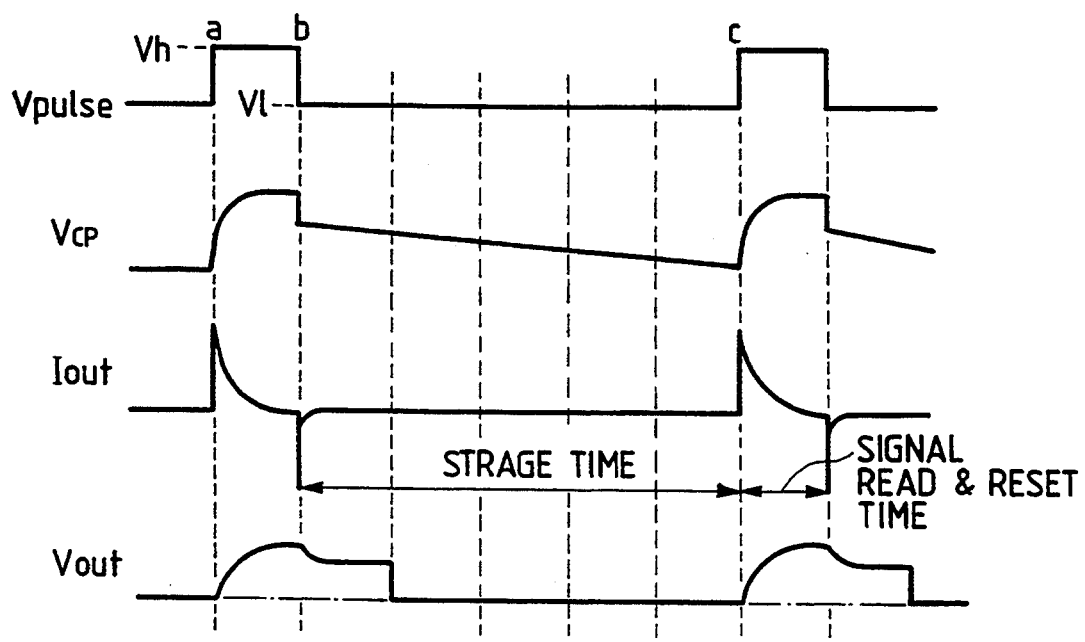
FIG. 36 is a timing chart depicting the reading operation of the image sensor shown in FIG. 35.
Figure 37:
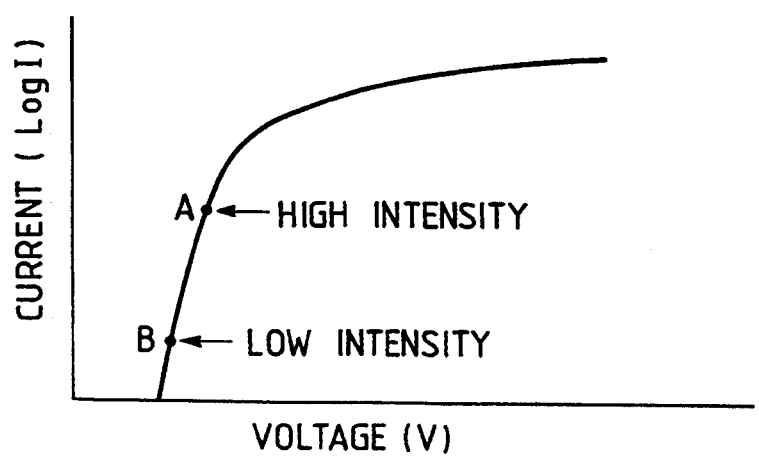
FIG. 37 is a graph showing the current vs voltage characteristic of an amorphous silicon diode.

If the signal reading line 106 and the pulsed voltage applying line 110 used in the image sensor (one pixel) shown in FIG. 18 are arranged alternately to run in a horizontal direction whereas a plurality of bias voltage applying lines 108 are arranged to run in a vertical direction, a planar structure as shown in FIG. 34 will be formed, with one pixel being the area surrounded by those lines. In FIG. 34, the parts that are composed in the same way as those which are shown in FIG. 18 are identified by like numerals. In the color image sensor shown in FIG. 34, the photodiodes and the diodes in each pixel are formed in the same plane and, hence, on account of the diode 103 that lies within one pixel and which is shielded from light by the metallization 153, the areas of the light-receiving region A of the photodiode 101 and the light-receiving region B of the photodiode 102, both of which contribute to photoelectric conversion, are so much limited as to lower their sensitivity.

In the embodiment shown in FIG. 32, the signal reading line 106 and the pulsed voltage applying line 110 are arranged alternately to run in a horizontal direction whereas a plurality of bias voltage applying lines 108 are arranged to run in a vertical direction beneath the photodiode 102, whereby the areas of light-receiving regions A and B in one pixel are increased. Stated more specifically, a chromium pattern 113 is provided, via the photoelectric transducer layer, beneath the photodiode 102 to form the diode 103, thereby producing a dual structure in which the photodiode 102 is superposed on the diode 103 with the anode being connected to the cathode. In FIG. 32, the parts that are composed in the same way as those which are shown in FIG. 18 are identified by like numerals.

The process for fabricating the color image sensor shown in FIG. 32 is described below with reference to FIG. 33. FIGS. 33(a) to FIG. 33(d) are cross sections of FIG. 32 as take on lines I—I, II-I, III—III, and IV—IV, respectively.

First, a metal film having a thickness of 700 Å is deposited from chromium over an insulating substrate 111 by either evaporation or sputtering; the metal film is then patterned by photolithography to form a chromium pattern 113 serving both as the lower electrode of the diode 103 and as the bias voltage applying line 108.

In the next step, an amorphous silicon (a-Si) film is deposited by plasma-assisted CVD. The amorphous silicon (a-Si) film has typically a thickness of 0.5 to 1.5 μm and its structure may be of any type that is selected from among pin (nip), in (ni) and pi (ip). Subsequently, a film of metal such as chromium is deposited in a thickness of 700 Å by either evaporation or sputtering and patterned by photolithography to form the upper electrode 133 of diode 103. This upper electrode 133 serves as the lower electrode 112 which is common to the first photodiode 101, the second photodiode 102 and the diode 104. The amorphous silicon (a-Si) film is dry etched to form a photoelectric transducer layer 123 generally equal in size to one pixel. For dry etching the a-Si film, a suitable gas such as $CF_4$ or $SF_6$ may be used.

Then, another amorphous silicon (a-Si) film is deposited by plasma-assisted CVD. The amorphous silicon (a-Si) film has typically a thickness of 0.5 to 1.5 μm and its structure may be of any type that is selected from among pin (nip), in (ni) and pi (ip). Subsequently, a transparent conductive film typically made of indium tin oxide is deposited in a thickness of 800 Å by either evaporation or sputtering and patterned by photolithography to form the upper electrode 131 of the first photodiode 101, the upper electrode 132 of the second photodiode 102 and the upper electrode 134 of the diode 104 (the upper electrode 132 is integral with the upper electrode 134); then, the amorphous silicon (a-Si) film is dry etched to form the photoelectric transducer layer 121 of the first photodiode 101, the photoelectric transducer layer 122 of the second photodiode 102 and the photoelectric transducer layer 124 of the diode 104 (the photoelectric transducer layer 122 is integral with the photoelectric transducer layer 124), with the first photodiode 101, the second photodiode 102 and the diode 104 being located over the photoelectric transducer layer 123. The four diodes are formed in such a way as to satisfy the relationship a/c=b/d, where a, b, c and d represent those areas of diodes 101, 102, 103 and 104, respectively, where the lower electrode, the photoelectric transducer layer and the upper electrode overlap. Therefore, the four diodes which are fabricated by the same process are uniform in characteristics and the ratio between the capacitance of the first photodiode 101 and the diode 103 when they are reverse biased is equal to a/c whereas the ratio between the capacitance of the second photodiode 102 and the diode 104 when they are reverse biased is equal to b/d and, hence, Ca/Cc=Cb/Cd, where Ca, Cb, Cc and Cd denote the capacitance of the respective diodes.

Then, an insulating film 140 is deposited over the entire surface and patterned to form contact holes 141 and 143 in the upper electrodes 131 and 134, respectively. Subsequently, an aluminum film is deposited and patterned to form a signal reading line 151 (106) covering the upper electrode 134 and a pulsed voltage applying line 114 (110) covering part of the upper electrode 131. Diode 104 has the same structure as photodiodes 101 and 102; however, with the upper electrode 134 being shielded from light by the signal reading line 151, the diode 104 will perform only a rectifying action. Since the upper electrode 133 of the diode 103 is formed of a metal film, it blocks light coming from above, thus performing only a rectifying action. In FIG. 33, the parts that are composed in the same way as those which are shown in FIGS. 19 and 20 are identified by like numerals.

In the embodiment described above, the photodiode 102 is superposed on the diode 103 to form a dual structure and, hence, even the area where the metallization 153 is provided for the diode 103 can be utilized as a light-receiving region; consequently, the percentage of one pixel that is occupied by the light-receiving region A of the first photodiode 101 and the light-receiving region B of the second photodiode 102 can be effectively increased.

In the embodiment described above, the upper electrode 133 of the diode 103 (i.e., the lower electrode 112 of the photodiodes 101 and 102) is formed of a metal film but, if desired, it may be formed of a doped a-Si:H film. In this alternative case, the photoelectric transducer layer 123 of the diode 103, its upper electrode 133 (i.e., the lower electrode 112 of the photodiodes 101 and 102), as well as the photoelectric transducer layers 121 and 122 of the photodiodes 101 and 102, respectively, can be deposited successively and, hence, the overall process of fabrication is simplified.

Using a gas prepared by doping 100% silane ($SiH_4$) gas with 1% phosphine ($PH_3$) gas, the doped a-Si:H film may be deposited by plasma-assisted CVD, with the substrate being held at a temperature of 180° to 350° C., to form a doped a-Si:H layer having a specific resistance of 100 Ω·cm.

With the image pickup device according to the first and second aspects of the present invention, the impedance that develops at the junction of two rectifiers when the photoelectric transducer is reset is determined by the current flowing under the voltage applied to the rectifier group and the charging current that flows when the charges stored in response to the incidence of light the photoelectric transducer are released to the ground. Therefore, if the voltage to be applied to the rectifier group is selected in such a way as to cause the flow of a current adequately larger than the charging current, the impedance at the junction can always be held at low level without being influenced by the amount of illumination on the photoelectric transducer and, hence, the transducer can be saturated within a predetermined reset time, thereby preventing the generation of residual charges. As a result, no image lag will be produced by residual charges and this contributes to an improvement in the resolution of the image pickup device.

If desired, a plurality of such image pickup devices may form an array in which the opposite ends of the individual rectifier groups are connected to terminals of shift registers, and the voltages to be applied across the respective rectifier groups are controlled by the pulsed voltages from the output terminals of the shift registers so that the voltage will be in forward or reverse direction with respect to each rectifier groups. In this way, the array of image pickup devices can be driven as a matrix, thus increasing the number of pixels that can be driven with a single output terminal of each shift register.

With the image sensor according to the third aspect of the present invention, the impedance that develops at the junction of two rectifiers when the second photodiode is reset is determined by the current flowing under the voltage applied to the rectifier group and the charging current that flows when the charges stored in response to the incidence of light on the second photodiode are released to the ground. Therefore, if the voltage to be applied to the rectifier group is selected in such a way as to cause the flow of a current adequately larger than the charging current, the impedance at the junction can always be held at low level without being influenced by the amount of illumination on the second photodiode and, hence, the second photodiode can be saturated within a predetermined reset time, thereby preventing the generation of residual charges. As a result, no afterimage will be produced by residual charges and this contributes to an improvement in the resolution of the image sensor.

Since the capacity portion is connected in parallel to the second photodiode, with the ratio between the capacities of the first photodiode and the diode being made generally equal to the ratio between the capacities of the second photodiode and the capacity portion, the noise that would otherwise occur on account of the current flowing out of the second photodiode into the first photodiode and the diode can be sufficiently reduced to improve the resolution of the image sensor.

What is claimed is:

1. An image pickup device comprising:
    rectifier means having two diodes connected in series in the same direction;
    a photoelectric transducer connected to a junction of said two diodes; and
    power supply means for applying either a forward or reverse-voltage to said rectifier means so that said junction is switched from a comparatively low-impedance state to a high-impedance state or vice versa, said power supply means comprising a dc power supply for applying a constant voltage to the cathode of said rectifier means and a pulser for applying a pulsed voltage to the anode of said rectifier means, the constant voltage Vb from said dc power supply, a high-level pulsed voltage Vh and a low-level pulsed voltage Vl satisfying the following relationship: $|Vl|<|Vb|<|Vh|$.

2. An image pickup device according to claim 1 wherein said two diodes of said rectifier means comprises an amorphous semiconductor, respectively.

3. An image pickup device according to claim 1 wherein said two diodes of said rectifier means comprises a polycrystalline semiconductor, respectively.

4. An image pickup device according to claim 1 wherein said photoelectric transducer comprises a photodiode, with the cathode thereof being connected to said junction and the anode being connected to a signal output line.

5. An array comprising a plurality of image pickup devices as recited in claim 4 that are juxtaposed and which have a signal output line in common.

6. An image pickup device according to claim 1 wherein an end of a capacitor is connected to said junction and the other end of said capacitor is connected to a signal output line.

7. An image pickup device according to claim 6 wherein said photoelectric transducer comprises a photodiode.

8. An image pickup device according to claim 6 wherein said photoelectric transducer comprises a photoconductor.

9. An image pickup device according to claim 6 further comprising an operational amplifier which is connected to said signal output line, and wherein a voltage providing a virtual ground point for the operational amplifier is applied to the side of the photoelectric transducer which is away from said junction.

10. An array comprising a plurality of image pickup devices as recited in claim 6 that are juxtaposed and which have a signal output line in common.

11. A system in which arrays of a plurality of image pickup devices as recited in claim 1 that are juxtaposed are arranged in a two-dimensional matrix, with the dc power supply of the power supply means being provided in common to all image pickup devices whereas the pulser is provided in common to each row of image pickup devices forming an array.

12. An image pickup device comprising:
    rectifier means having a photodiode and a diode each made of an amorphous or polycrystalline semiconductor connected in series in the same direction;
    a capacitor connected at one end to a junction of said two diodes;
    a signal output line connected to the other end of said capacitor; and
    power supply means for forward-biasing said rectifier means to generate a comparatively low impedance at said junction and for reverse-biasing said rectifier means to generate a comparatively high impedance at said junction, said comparatively low impedance being unaffected by an illumination received by said photoelectric transducer.

13. An image pickup device according to claim 12 wherein said power supply means comprises a dc power supply for applying a constant voltage to the cathode of said rectifier means and a pulser for applying a pulsed voltage to the anode of said rectifier means, the constant voltage Vb from said dc power supply, a high-level pulsed voltage Vh and a low-level pulsed voltage Vl satisfying the following relationship: $|Vl|<|Vb|<|Vh|$.

14. A system in which arrays of a plurality of image pickup devices as recited in claim 13 that are juxtaposed are arranged in a two-dimensional matrix, with the dc power supply of the power supply means being provided in common to all image pickup devices whereas the pulser is provided in common to each row of image pickup devices forming an array.

15. An array comprising a plurality of image pickup devices as recited in claim 12 that are juxtaposed and which have a signal output line in common.

16. An array in which a plurality of image pickup devices as recited in claim 12 are juxtaposed to form a block and a plurality of such blocks are arranged to compose the array, further characterized in that the cathodes of the rectifier groups in each block of image pickup devices are connected to a first shift register at the associated terminals whereas the anodes of said rectifier means in each block of image pickup devices are connected to a second shift register at the associated terminals, and the high-level and low-level pulsed voltages Vrh and Vrl successively delivered from the respective terminals of said first shift register, and the high level and low-level pulsed voltages Vch and Vcl successively delivered from the respective terminals of said second shift register satisfy the relationship $Vcl<Vrl<Vch<Vrh$.

17. An image pickup device according to claim 12, wherein said power supply means applies said forward or reverse bias directly to said photodiode of said rectifier group.

18. An image sensor comprising:
    rectifier means having a first photodiode and a diode which are connected in series in the same direction;
    a second photodiode connected to a junction of said first photodiode and said diode at an end having the same polarity as said first photodiode;
    a reading circuit connected to said second photodiode at the other end away from said junction;
    a capacity portion connected in parallel to said second photodiode; and
    power supply means for applying either a forward or reverse voltage to said rectifier means so that said junction is switched from a comparatively low-impedance state to a high-impedance state or vice versa, the ratio between the capacities of said first photodiode and said diode being made generally equal to the ratio between the capacities of said second photodiode and said capacity portion.

19. An image sensor according to claim 18 wherein said second photodiode has a photoelectric transducer layer sandwiched between a lower electrode and a transparent upper electrode, part of said transparent upper electrode being shielded from light to form said capacity portion.

20. An image sensor according to claim 18 wherein said power supply means comprises a dc power supply for applying a constant voltage to said diode so as to reverse bias said rectifier means and a pulser for applying a pulsed voltage to said first photodiode, and wherein a constant voltage Vb from said dc power supply, a high-level pulsed voltage Vh and a low-level pulsed voltage Vl satisfies the following relationship in terms of absolute values: $|Vl| < |Vb| < |Vh|$.

21. An image sensor according to claim 18 wherein each of said photodiode and said diode has a photoelectric transducer layer sandwiched between a lower electrode and an upper electrode, said photoelectric transducer layer comprising a non-doped a-Si:H layer, an inner doped a-Si:H layer and an outer doped a-Si:H layer having a lower specific resistance than said inner doped a-Si:H layer, with the topmost non-doped a-Si:H layer being overlaid with the electrode that blocks electrons during reverse biasing.

22. An image sensor according to claim 18 wherein each of said photodiode and said diode has a photoelectric transducer layer sandwiched between a lower electrode and an upper electrode, said photoelectric transducer layer comprising an outer non-doped a-Si:H layer, an inner non-doped a-Si:H layer deposited at a higher substrate temperature than said outer non-doped a-Si:H layer, and a doped a-Si:H layer, with the topmost outer non-doped a-Si:H layer being overlaid with the electrode that block electrons during reverse biasing.

23. An image sensor according to claim 18 wherein isolated photoelectric transducer layers are formed on a lower electrode, an upper electrode being formed on each of said photoelectric transducer layers to form said first and second photodiodes, a photoelectric transducer layer and an electrode being provided beneath said first or second photodiode to form said diode.

24. An image sensor according to claim 23 wherein said lower electrode is formed of a doped a-Si: film.

25. An array having a plurality of image pickup devices being grouped into a plurality of blocks, each of said image pickup devices comprising rectifier means having two diodes connected in series in the same direction, a photoelectric transducer having a cathode connected to a junction of said two diodes, and power supply means for forward-biasing said rectifier means to generate a comparatively low impedance at said junction and for reverse-biasing said rectifier means to generate a comparatively high impedance at said junction, said comparatively low impedance being unaffected by an illumination received by said photoelectric transducer, comprising:

a first register having terminals connected to corresponding ones of said rectifier means at corresponding cathodes which function as terminals of said rectifier means, for successively delivering high-level and low-level pulsed voltages Vrh and Vrl at said terminals of said first register;

a second register having terminals connected to corresponding ones of said rectifier means at corresponding anodes which function as terminals of said rectifier means, for successively delivering high-level and low-level pulsed voltages Vch and Vcl at said terminals of said second register, said voltages Vrh, Vrl, Vch, and Vcl satisfying a relationship $Vcl < Vrl < Vch < Vrh$.

26. An array according to claim 25 wherein the image pickup devices in each block are composed in such a way that two or more pixels form one group and every group of image pickup devices is connected to a signal output line.

* * * * *

UNITED STATES PATENT AND TRADEMARK OFFICE
CERTIFICATE OF CORRECTION

PATENT NO. : 5,376,782
DATED : December 27, 1994
INVENTOR(S) : Chikaho IKEDA et al It is certified that error appears in the above-indentified patent and that said Letters Patent is hereby corrected as shown below:

Claim 26, Column 26, Line 40 delete "signal".

Signed and Sealed this

Sixteenth Day of May, 1995

Attest:

Attesting Officer

BRUCE LEHMAN

Commissioner of Patents and Trademarks